US006070787A

United States Patent [19]

Harada et al.

[11] Patent Number: 6,070,787

[45] Date of Patent: Jun. 6, 2000

[54] METHOD OF MANUFACTURING CHIP COMPONENTS

[75] Inventors: Shinichi Harada; Kiyoshi Tanbo; Sadaaki Kurata, all of Tokyo; Manabu Teraoka; Ikuo Kakiuchi, both of Wakayama, all of Japan

[73] Assignees: Taiyo Yuden Co., Ltd., Tokyo; Chuki Seiki Co., Ltd., Wakayama, both of Japan

[21] Appl. No.: 08/960,368

[22] Filed: Oct. 29, 1997

[30] Foreign Application Priority Data

Oct. 31, 1996 [JP] Japan .................................... 8-290436

[51] Int. Cl.[7] ..................................................... H01L 21/00

[52] U.S. Cl. ........................ 228/164; 228/141.1; 228/165; 228/168; 228/169; 228/170

[58] Field of Search ................................ 228/164, 141.1, 228/165, 168, 169, 170

[56] References Cited

U.S. PATENT DOCUMENTS

| | | | |
|---|---|---|---|
| 4,313,262 | 2/1982 | Barnes et al. | 29/840 |
| 5,149,662 | 9/1992 | Eichelberger | 437/8 |
| 5,233,327 | 8/1993 | Bartush et al. | 338/195 |
| 5,400,218 | 3/1995 | Val | 361/709 |
| 5,634,268 | 6/1997 | Dalal et al. | 29/840 |

*Primary Examiner*—Patrick Ryan
*Assistant Examiner*—M. Alexandra Elve
*Attorney, Agent, or Firm*—Lowe, Hauptman, Gopstein, Gilman & Berner, LLP

[57] ABSTRACT

A chip component is manufactured through a step of burning a unburned unit element made of ceramics having prism-shaped parts at its ends, a step of polishing the edges of the burned unit element, and a step of forming a resistor conductor, an electrode conductor and a armor on the polished unit element.

16 Claims, 19 Drawing Sheets

METHOD OF MANUFACTURING CHIP COMPONENTS

BACKGROUND OF THE INVENTION

1. Field of the Invention

This invention relates to a method of manufacturing a chip component such as a chip resistor, and to an apparatus for manufacturing a unit element for use in the manufacture of the chip component, and to a structure for mounting the chip component manufactured by the method as mentioned above onto a substrate or the like.

2. Description of the Prior Art

A cylindrical chip resistor is known as a typical chip component applicable to a chip component feeding apparatus for feeding one by one in a predetermined orientation a multiplicity of chip components accommodated in bulk.

This chip resistor has a cylindrical ceramic unit element, a resistance conductor formed over the entire surface of the unit element, an armor covering the center of the resistance conductor and a pair of electrode conductors covering the ends of the resistance conductor. The resistance conductor is trimmed with grooves to control the resistance value, if necessary.

This known chip resistor is no need to orient its obverse and reverse side when it is fed by the apparatus, because its having no obverse and reverse side. But it is liable to roll because of its cylindrical shape, resulting in an unstable mounting onto the substrate or the like and hence in defectiveness such as a positional offset. This inconvenience applies to other similarly shaped chip components than the chip resistor.

SUMMARY OF THE INVENTION

It is a first object of the present invention to provide a new and improved method of manufacturing a chip component ensuring a stable mounting onto a substrate or the like and capable of being applied into a chip component feeding apparatus for feeding one by one in a predetermined orientation chip components accommodated in bulk.

A second object of the present invention is to provide a new and improved unit element manufacturing apparatus capable of efficiently manufacturing a unit element for use in the manufacture of the chip component described in the first object.

A third object of the present invention is to provide a new and improved chip component mounting structure ensuring a satisfactory connection of the chip component associated with the first object onto a substrate or the like.

In order to achieve the first object, according to a first aspect of the present invention, a method of manufacturing a chip component is provided. The method comprises the steps of burning an unburned unit element made of ceramic having prism-shaped parts at its ends; polishing edges of the burned unit element; and forming on the polished unit element a circuit conductor, an electrode conductor and an armor.

In order to achieve the second object, according to a second aspect of the present invention, an apparatus for manufacturing a unit element for a chip component is provided. The apparatus comprises a chuck for holding a prism-shaped base element in a predetermined orientation to rotate the base element around its central axis or an axis parallel thereto; a chuck wheel for translating the rotational axis of the chuck parallely along a predetermined arc trajectory; and a grinding tool turning at a position adjoining the arc trajectory to grind the center of the base element which is translated parallelly in rotation along the arc trajectory.

In order to achieve the third object, according to a third aspect of the present invention, a chip component mounting structure is provided. The structure in which a chip component exposes to the exterior an electrode conductor and an armor which are contiguous to each other, and in which the electrode conductor is connected to a substrate electrode by a bonding material such as solder, wherein at the boundary between the electrode conductor and the armor, there is provided a gap at which the armor is inwardly hollowed to expose the surface of the electrode conductor to the exterior, so that upon the connection of the component, the bonding material can reach the gap and adhere to the exposed surface of the electrode conductor at the gap.

These and other related objects, aspects, features and advantages of the present invention will become apparent from the following detailed description in conjunction with the accompanying drawings.

DESCRIPTION OF THE PREFERRED EMBODIMENTS

Figure 1:
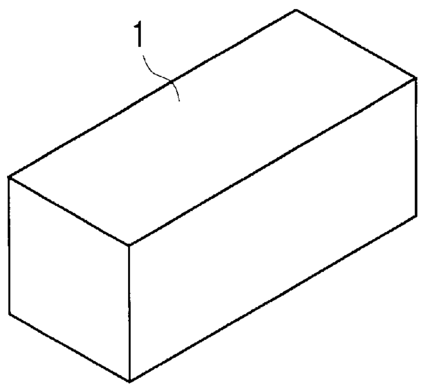
FIGS. 1(*a*) to 1(*f*) shows a process for manufacturing a chip resistor in accordance with the present invention.
Figure 1:
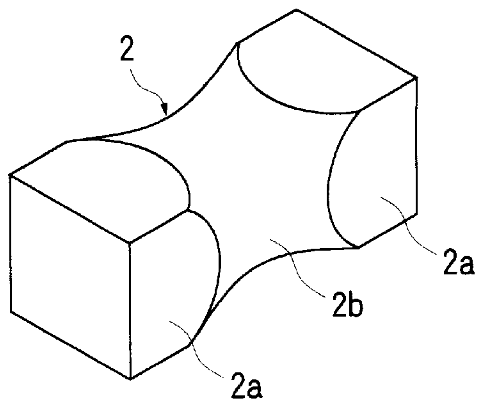
Figure 1:
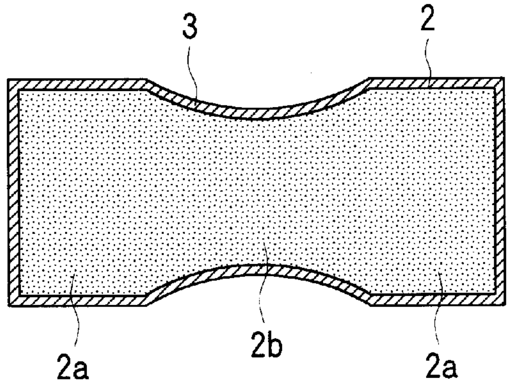
Figure 1:
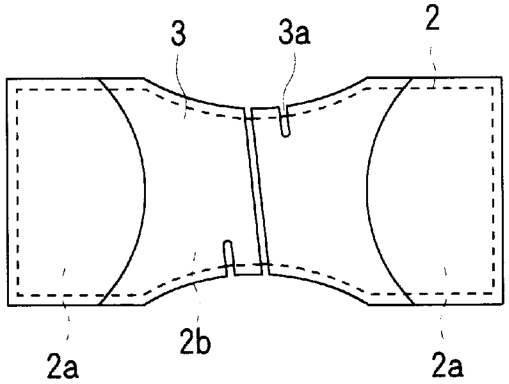
Figure 1:
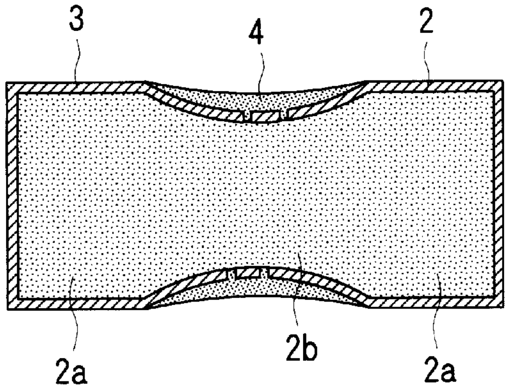
Figure 1:
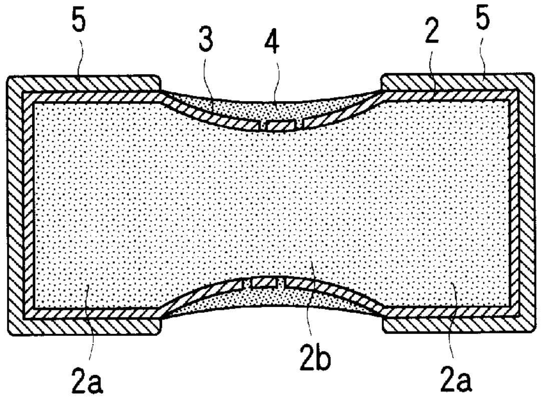
Figure 2:
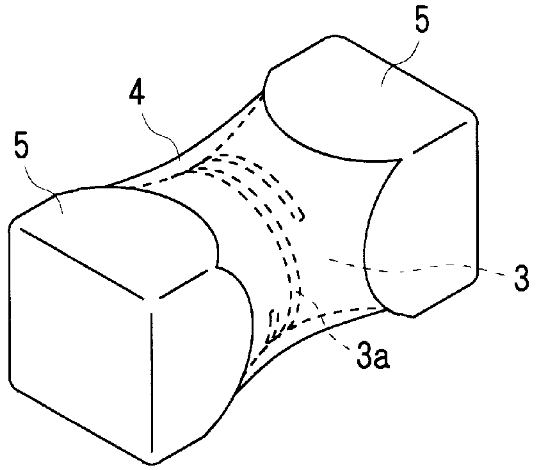
FIG. 2 is a perspective view showing an external appearance of the chip resistor manufactured through the process shown in FIGS. 1(*a*) to 1(*f*)

FIGS. 1(*a*) to 1(*f*) shows a process for manufacturing a chip resistor in accordance with the present invention. FIG. 2 is a perspective view showing an external appearance of the chip resistor manufactured through that process.

For the manufacture of the chip resistor shown in FIG. 2, an unburned base element 1 made of ceramic in the shape of a prism as shown in FIG. 1(*a*) is prepared. The base element 1 is formed by extruding ceramic slurry to obtain a rod of a square in cross-section and cutting the rod into a predetermined dimension in turn. The ceramic slurry is prepared by mixing a binder, a solvent medium, etc., into alumina particles (70 wt % or more).

A multiplicity of base elements 1 are then introduced into a firing furnace for a provisional burning in a lump under conditions of burning temperature of 100 to 200° C. and burning time of 1 to 2 hours to impart thereto a hardness suitable for polishing and grinding which will be described later.

After having been preliminarily burned, the base elements 1 are loaded into a barrel polishing machine such as a centrifugal barrel or an eccentric rotary barrel and are polished in a lump. Consequently, principally the edges of the base elements 1 are deburred and rounded. After polishing is completed, defectives are removed by screening or visual inspection to select non-defectives.

The polished base elements 1 are then individually grind around their centers to create unit elements 2 each having such a shape as shown in FIG. 1(*b*). As is apparent from the figure, the unit element 2 includes prism parts 2*a* at both ends which are symmetric with respect to its center and an intermediate part 2*b* between the prism-shaped parts 2*a* which has a hourglass shape and a cross-sectional shape similarly gradually increasing from its center toward the prism-shaped parts 2*a*. The hourglass-shaped part 2*b* of the shown example has a circular basic cross section. The surface of the hourglass-shaped part 2*b* is continuous smoothly with the surfaces of the prism-shaped parts 2*a* by arc boundaries. Specific techniques for this grinding step will be detailed later in connection with a configuration of the apparatus used in that step.

A multiplicity of unit elements 2 obtained as a result of the grinding operation are then introduced into the firing furnace for proper burning in a lump under conditions of burning temperature of 1300 to 1500° C. and burning time of two hours.

After the proper burning, the unit elements 2 are then loaded into the barrel polishing machine such as the centrifugal barrel or the eccentric rotary barrel and are polished in a lump. Consequently, principally the edges of the unit elements 2 are deburred and rounded.

Subsequently, as shown in FIG. 1(*c*), an even thickness of Ni—Cr based or ruthenium oxide based resistance conductor 3 is formed on the entire surface of the grind unit element 2 by use of thin-film forming techniques such as sputtering or vacuum deposition, or by use of thick-film forming techniques such as paste coating. Since the edges of the unit element 2 have been rounded through the previous polishing step, it is prevented for the edge portions to have a film thickness smaller than the remaining portions.

The resistor conductor 3 formed on the surface of the unit element 2 is then subjected to trimming for adjusting the resistance value, as shown in FIG. 1(*d*). More specifically, a groove 3*a* is formed in the resistance conductor 3 on the hourglass-shaped part 2*b* while bringing a resistance value detecting terminal into contact with the prism-shaped parts 2*a*, to perform a regulation of the resistance value. The groove 3*a* may be formed through partial grinding by a grinding blade, or alternatively may be formed through partial melting by means of a laser beam within the infrared region.

Subsequently, as shown in FIG. 1(*e*), an insulative armor 4 of epoxy resin or silicon glass is formed on the surface of the resistance conductor 3 on the hourglass-shaped part 2*b* by use of thick-film forming techniques such as paste coating. As can been seen in the figure, the armor 4 has also an hourglass shape similar to the hourglass-shaped part 2*b* and has a film thickness gradually decreasing from its center toward its ends. Specific techniques for this armoring step will be described in detail later in connection with a configuration of the apparatus used in that step.

Finally, as shown in FIG. 1(*f*), an even thickness of nickel or Sn—Pb alloy electrode conductor 5 is formed on the surfaces of the prism-shaped parts 2*a* (each including one end surface and four peripheral surfaces) by use of thin-film forming techniques such as electrolytic plating or non-electrolytic plating. The extremities of the electrode conductors 5 may abut against the extremities of the armor 4, or alternatively the former may be adjacent to the latter by slightly spaces. Since the edges of the unit element 2 have been rounded through the previous polishing step, the edge portions are prevented from having a film thickness smaller than the remaining portions. In this manner, the chip resistor as shown in FIG. 2 is manufactured.

Detailed description will now be made of a specific technique of the grinding step in connection with a configuration of the apparatus used in that step.

Figure 3:
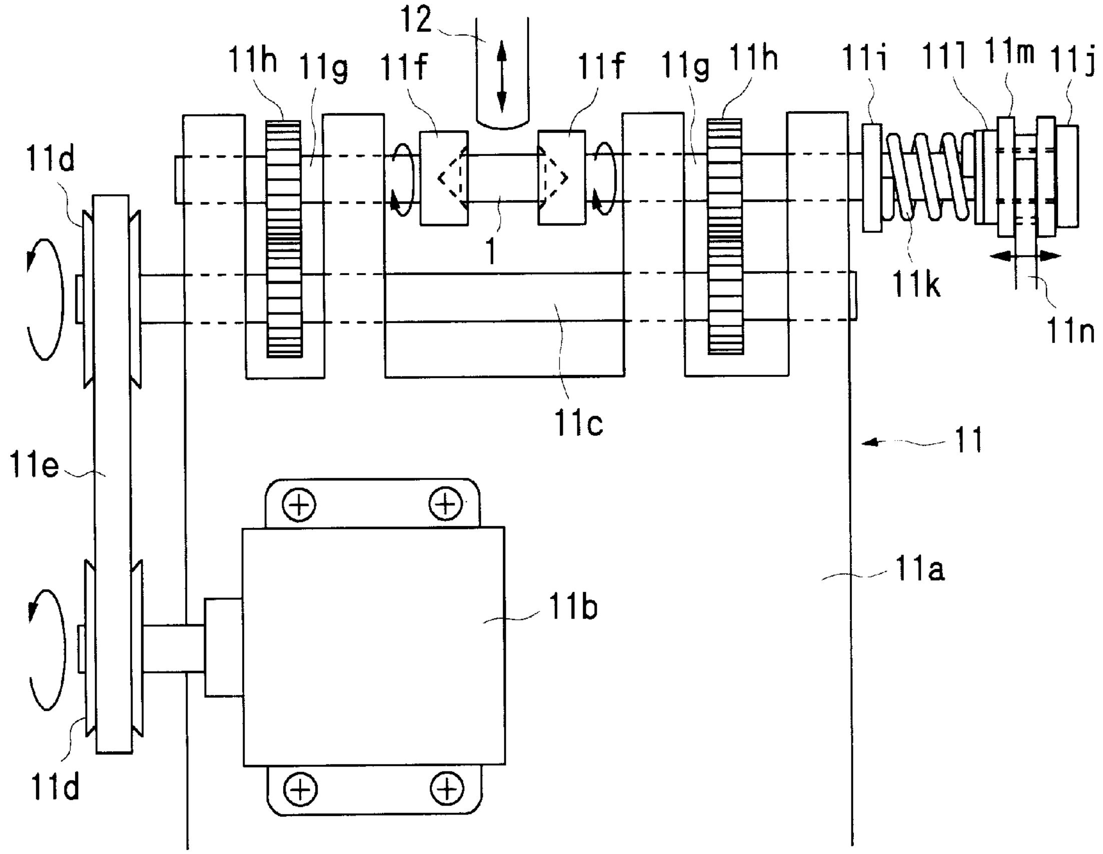
FIG. 3 shows an example of a unit element manufacturing apparatus for use in a grinding step.

Referring to FIG. 3 there is depicted by way of example a unit element manufacturing apparatus which comprises a chuck mechanism generally designated at 11 and a grinding blade 12.

The chuck mechanism 11 includes a frame 11*a*, a motor 11*b* firmly secured to the frame 11*a*, a transmission shaft 11*c* rotatably supported on the frame 11*a*, a belt 11*e* wound around pulleys 11*d* on the motor shaft and of the transmission shaft 11*c*, a pair of chuck shafts 11*g* rotatably supported on the frame 11*a* in such a manner that their respective chucks 11*f* confront each other, and gears 11*h* for transmitting the rotation of the transmission shaft 11*c* to the chuck shafts 11*g*, with confronting faces of the chucks 11*f* each provided with a circular recess for holding the ends of the base element 1.

The right-hand chuck shaft 11*g* in the diagram is transversely movable and is provided with two flanges 11*i* and 11*j*. A coiled spring 11*k*, a bearing 11*l* and an operating ring 11*m* are rotatably interposed between the two flanges 11*i* and 11*j*. And also the operating ring 11*m* is engaged with a drive arm 11*n* driven by a drive source not shown.

The grinding blade 12 on the other hand is comprised of e.g., a diamond blade and is adapted to rotate in a predetermined direction around a rotational shaft parallel to the chuck shafts 11*g* by a drive source not shown. The grinding blade 12 is capable of advancing and retreating orthogonally toward and from the center of rotation of the base element 1 clamped by the chucks 11*f*. The grinding edge of the grinding blade 12 has a rounding corresponding to the shape of the curved surface of the hourglass-shaped part 2*b* of the unit element 2.

In the chuck mechanism 11, the drive arm 11*n* is used to displace the chuck shaft 11*g* on the displaceable side to the right in the diagram by the operating ring 11*m*, thereby bringing the chuck 11*f* at the end of that chuck shaft 11*g* away from the other chuck 11*f* to widen the space between the opposed chucks 11*f*. The base element 1 is inserted into the thus widened space between the opposed chucks 11*f*, and then the chuck shaft 11*g* on the displaceable side is returned to the shown position, thereby enabling the opposed chucks 11*f* to clamp the base element 1 therebetween coaxially with the chuck shafts 11*g*. The base element 1 clamped between the opposed chucks 11*f* can be rotated in a predetermined direction through the transmission of rotation of the motor 11*b* to the chuck shafts 11*g* by the pulleys 11*d*, the belt 11*e*, the transmission shaft 11*c* and the gears 11*h*.

Thus, while the base element 1 rotates in a predetermined direction, the grinding blade 12 is gradually advanced toward the rotational axis of the base element 1 to grind the center of the prism-shaped base element 1 into a profile corresponding to the shape of the grinding edge of the grinding blade 12, to produce the unit element 2 having a shape shown in FIG. 1(*b*). By shifting the operating ring 11*m* to the left in the diagram from the shown position to compress the coiled spring 11*k* to increase the clamping pressure applied to the base element 1, the base element 1 can be prevented from sliding on the surfaces of the chucks 11*f* due to the grinding resistance.

Figure 4:
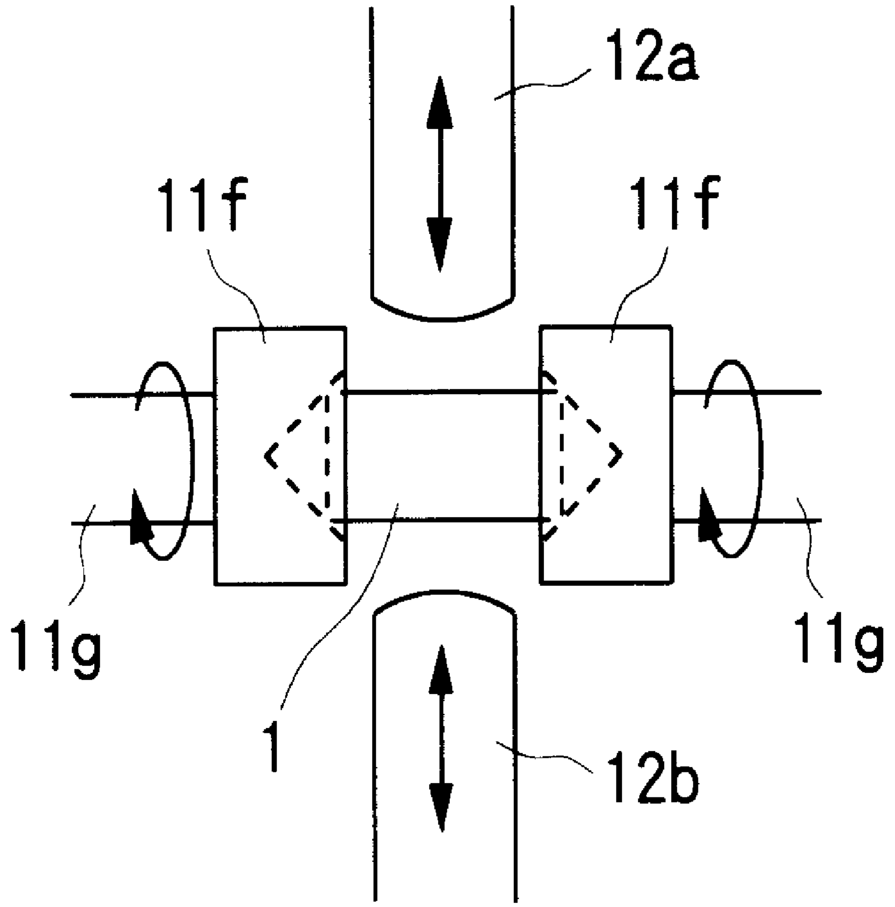
FIG. 4 shows a variant of the unit element manufacturing apparatus shown in FIG. 3.

Although the base element 1 may be grind by a single grinding blade 12 as mentioned above, a more precise grinding of the base element 1 could be effected by use of two different types of grinding blades with different grinding degrees of roughness, that is, a first blade 12*a* for rough grinding and a second blade 12*b* for fine grinding as shown in FIG. 4. It is natural in the case of using a plurality of grinding blades a grinding method may be employed in which maximum grinding depth differs for each blade so that the grinding depth increases stepwise.

Figure 5:
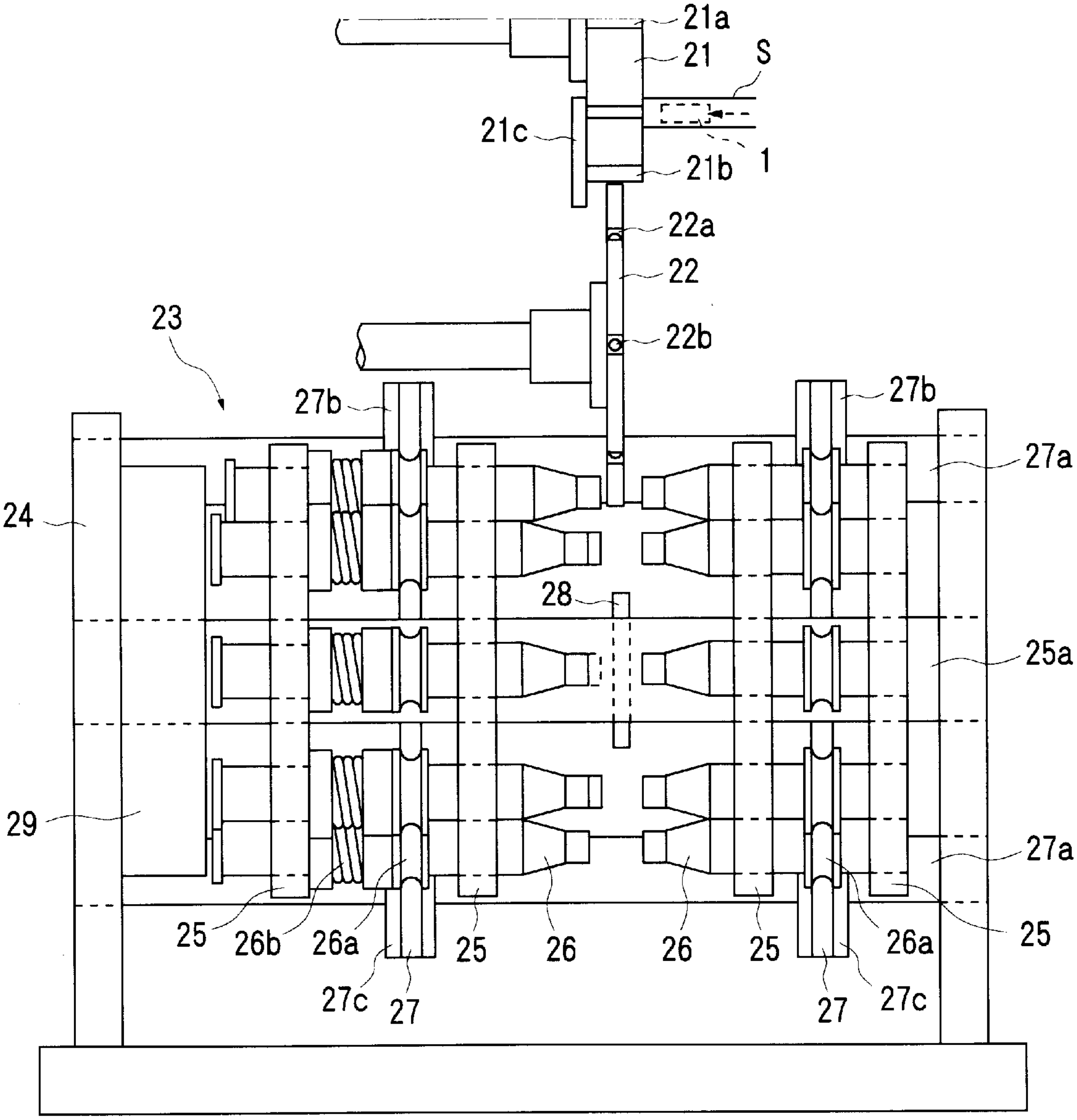
FIG. 5 shows another example of the unit element manufacturing apparatus for use in the grinding step.

Referring to FIG. 5, there is depicted another example of the unit element manufacturing apparatus which comprises a feeding rotor 21, a relay rotor 22 and a grinding mechanism 23.

Figure 6:
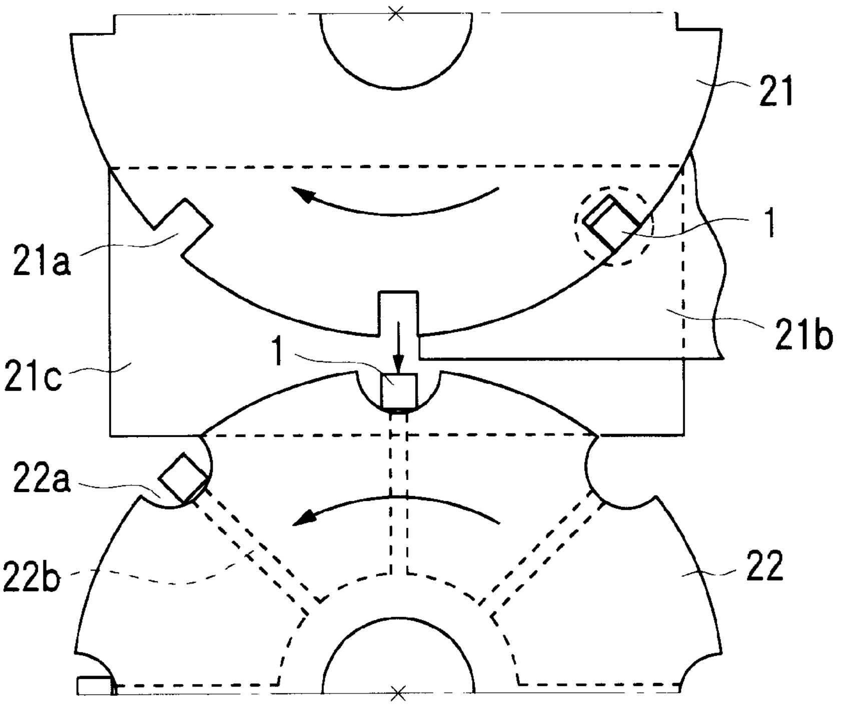
FIGS. 6, 7, 8(*a*), 8(*b*), 8(*c*), 9(*a*), 9(*b*), 10, 11, 12 and 13 are explanatory views of actions of the unit element manufacturing apparatus shown in FIG. 5.

The feeding rotor 21 delivers the base element 1 supplied through a pipe-like chute S to the relay rotor 22 and also as shown in FIG. 6, it includes circumferentially equiangularly spaced receiving grooves 21*a* (eight at 45 degrees intervals in the diagram) on its periphery. Each receiving groove 21*a* has a substantially square section matching the shape of the end faces of the base element 1 so that a base element 1 supplied sideways through the chute connection point (indicated by a dotted line circle) can be inserted into a receiving groove 21*a* with the same posture, namely, with its end face forward. In the base element delivery area, the feeding rotor 21 includes a curve guide 21*b* for defining a drop feeding position of the base element 1, and a flat guide 21*c* for restricting an inserting position of the base element 1 into the receiving guide 21*a*.

Figure 7:
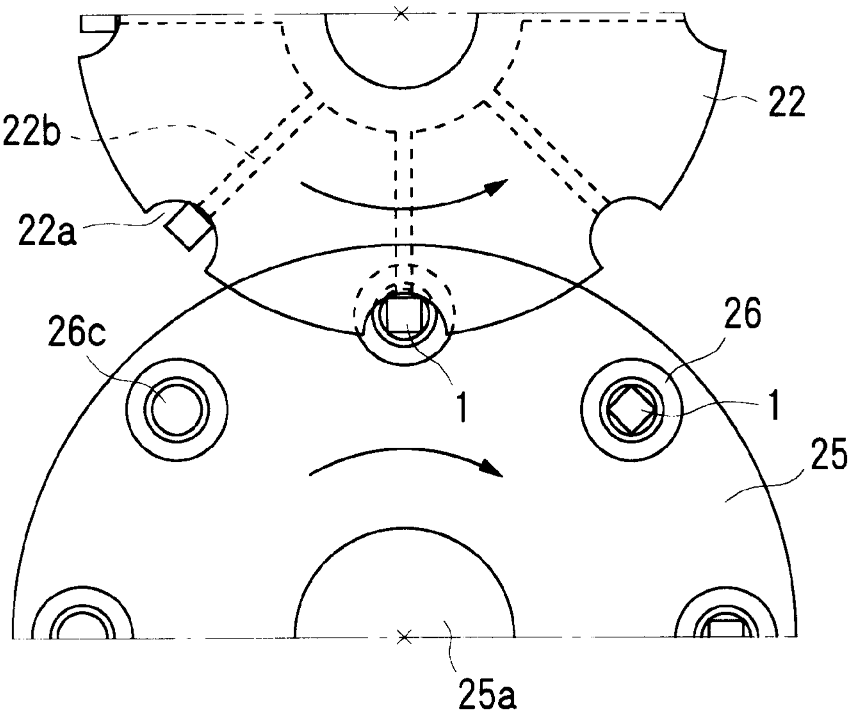

The relay rotor 22 delivers to a chuck 26 the base element 1 fed from the feeding rotor 21 and also as shown FIGS. 6 and 7, it includes circumferentially equiangularly spaced receiving grooves 22*a* (eight at 45 degrees intervals in the diagram) on its periphery. Each receiving groove 22*a* has a substantially semicircular section larger than the shape of the end faces of the base element 1. The relay rotor 22 further includes therewithin a plurality of air suction holes 22*b* each leading radially to the bottom of the associated receiving groove 22*a* so that the base element 1 dropped from the feeding rotor 21 can be inserted with the same posture as the above into a receiving groove 22*a* and sucked by a negative pressure generated by the air suction hole 22*b*.

Referring back to FIG. 5, the grinding mechanism 23 includes a frame 24, a pair of right and left chuck wheels 25, a plurality of chucks 26 provided on each of the chuck wheels 25, a couple of belts 27 for rotating the chucks 26, a grinding blade 28 comprised of e.g., a diamond blade, and a chucking control unit 29.

The pair of chuck wheel 25 are each in the form of a disk with the same shape and are mounted to a shaft 25*a* secured to the frame 24. Although not shown, a rotational drive source such as a motor is connected to the end of the shaft 25*a* so that during the grinding process the pair of right and left chuck wheels 25 can rotate in the same direction at the same speed.

The plurality of chucks 26 are arranged circumferentially and equiangularly (eight at 45 degrees intervals in the diagram) and to confront each other on the periphery of each of the chuck wheels 25. The chucks 26 on the chuck wheel 25 on the right side in FIG. 5 are attached to the chuck wheel 25 by bearings not shown to rotate around the central axes. The chucks 26 on the right-hand chuck wheel 25 are each provided with a pulley part 25*a* contacted by a belt 27. On the other hand, the chucks 26 on the left-hand chuck wheel 25 in FIG. 5 are attached to the chuck wheel 25 by bearings not shown, allowing both rotations around the central axes and transverse movement. The chucks 26 on the left-hand chuck wheel 25 are also each provided with a pulley 26*a* similar to that of the chucks 26 on the other side. Furthermore, the chucks 26 on the left-hand chuck wheels 25 are each biased to the right by a coiled spring 26*b* in FIG. 5.

Figure 8:
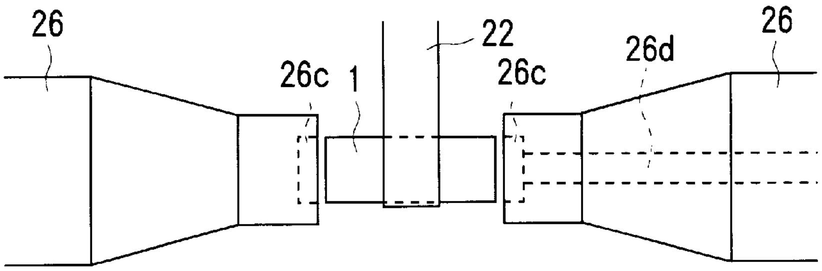
Figure 8:
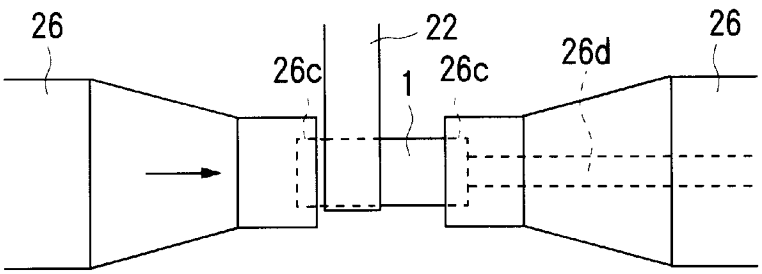
Figure 8:
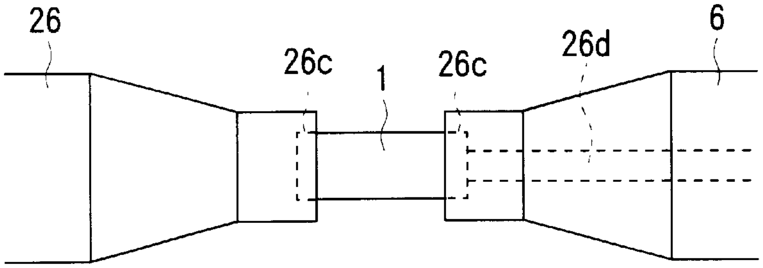

Each chuck 26 is in the form of a cylindrical member having at its tip a circular recess 26*c* as shown in FIGS. 8(*a*) to 8(*c*). In the shown example, the chucks 26 on the left side in FIG. 5 are brought nearer or away to enable the two confronting chucks 26 to hold or release the base element 1 in cooperation. The chucks 26 arranged on the right-hand chuck wheel 25 in FIG. 5 are each provided with air suction holes 26*d* leading to the bottom of the recess 26*c* as shown in FIGS. 8(*a*) to 8(*c*) so that the base element 1 can be held by a sucking force generated in the air suction hole 2*b* in addition to a clamping force by the both chucks relatively approaching each other.

Figure 10:
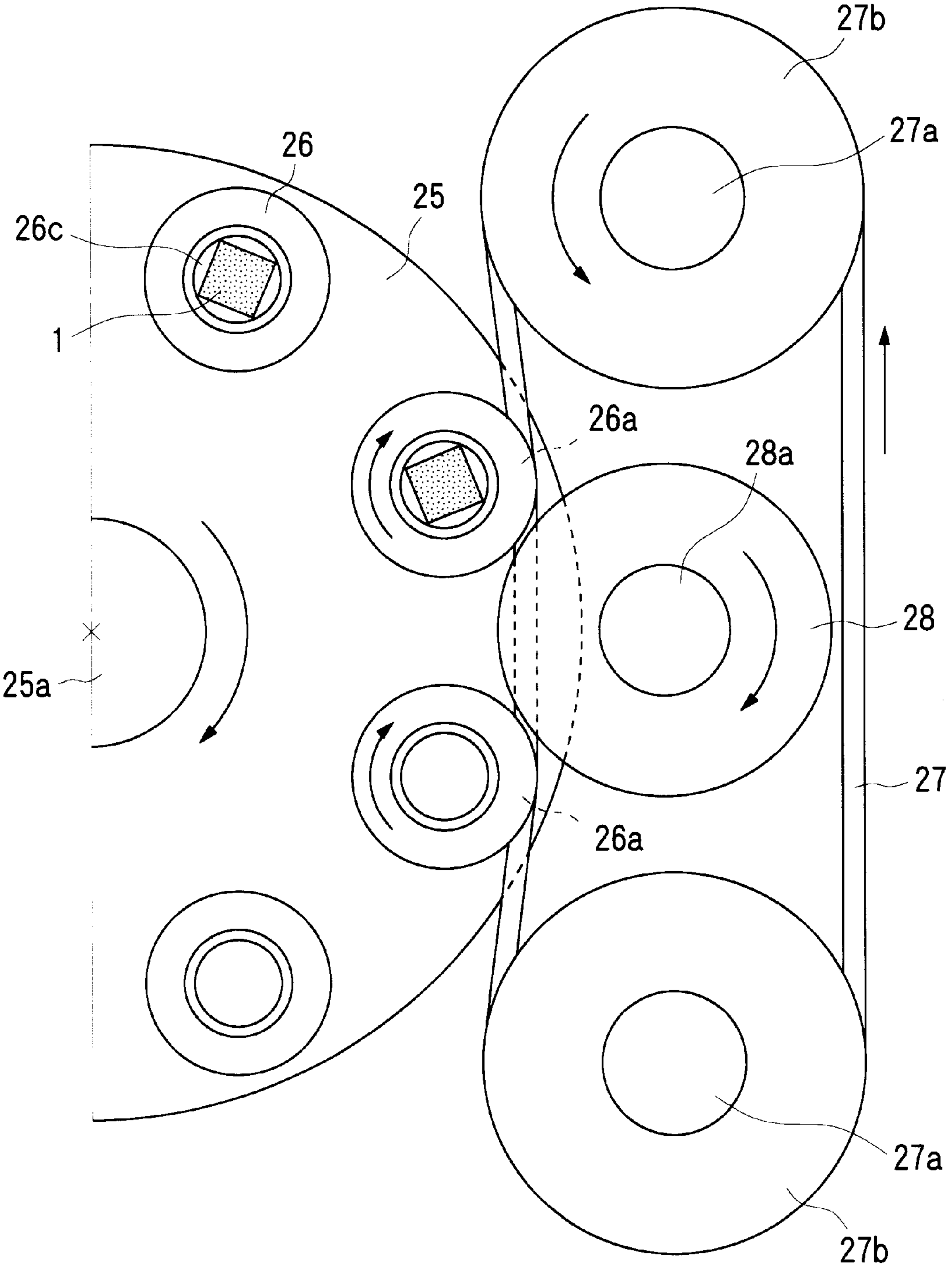

The couple of belts 27 for rotating the chucks selectively rotate the chucks 26 arranged on the chuck wheel 25, and also as shown in FIG. 10 extend vertically adjacent to the chuck wheels 26. More specifically, the belts 27 are vertically wound with a predetermined tension around a driving pulley 27*b* and a driven pulley 27*c* which are attached to upper and lower shafts 27*a* mounted on the frame 24 so as to extend parallel to the shaft 25*a*, and simultaneously are in partial contact with the pulley parts 26*a* of the chucks 26 arranged on the right and left chuck wheels 25 of FIG. 5. Although not shown, a rotational drive source such as a motor is connected to the end of the shaft 27*a* associated with the driving pulley 27*b* so that during the grinding process, the couple of belts can rotate in the same direction at the same speed, causing the chucks 26 contacted by the belts 27 to rotate in the opposite direction.

Figure 9:
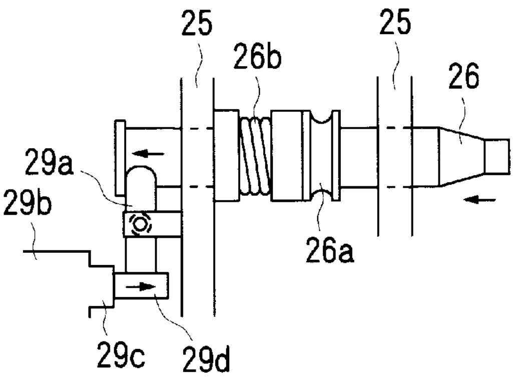
Figure 9:
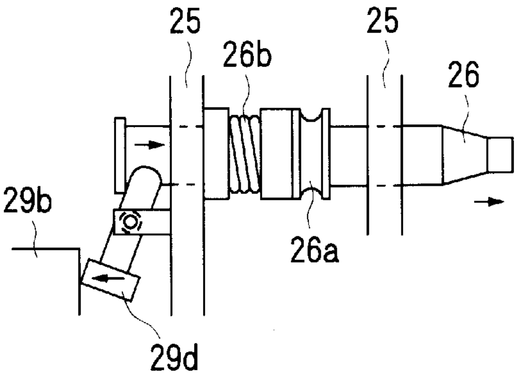

The grinding blade 28 grinds the center of the base element 1 retained by the opposed chucks 26, and as shown in FIG. 10, it is attached to the shaft 28*a* mounted on the frame 24 so as to extend parallel to and level with the shaft 25*a*. The grinding blade 28 is partially positioned between the opposed chucks on the two chuck wheels 25. Although not shown, a rotational driving source is connected to the end of the shaft 28*a* so that during the grinding process which will be described later, the grinding blade 28 can rotate in the opposite direction to that of the chucks 26 at a constant speed. In the same manner as the apparatus shown in FIG. 3, the grinding edge of the grinding blade 28 is provided with a rounding corresponding to the profile of the hourglass-shaped part 2*b* of the unit element 2. The chucking control unit 29 imparts a base element holding action to the chucks 26 at the pre-grinding positions and to impart a base element hold releasing action to the chucks 26 at the post-grinding positions. The chucking control unit 29 selectively operates the end of the chucks 26 arranged on the chuck wheel 25 on the left side of FIGS. 25(*a*) to 25(*d*) to thereby control the base element 1 holding action and the hold releasing action. More specifically, as shown in FIGS. 9(*a*) and 9(*b*), the chucking control unit 29 includes a lever 29*a* whose one end is engaged with the end of each chuck 26, and a cam plate 29*b* for pivoting the lever 29*a*, the cam plate 29*b* being provided with a raised portion 29*c* for drawing the chuck 26, over a predetermined angular range (in the shown example, a range short of the base element 1 hold releasing position starting from the base element 1 holding position). The end of each lever 29*a* contacted by the cam plate 29*b* is provided with a roller 29*d* for significantly reducing the contact resistance between the lever 29*a* and the cam plate 29*b* caused when the chuck wheels 25 rotate.

Thus, in the chucking control unit 29, the end roller 29*d* of the lever 29*a* is pressed by the raised portion 29*c* of the cam plate 29*b*, to draw to the left in the diagram the chuck 26 engaging with the other end of the lever 29*b* against the spring biasing force, to release the holding of the base element 1 (see FIG. 8(*a*)). Also, by releasing the pressing of the lever 29*a* against the end roller 29*d*, the chuck 26 engaging with the other end of the lever 29*b* can be removed toward the right in the diagram with the aid of the spring biasing force to hold the base element 1 (see FIGS. 8(*b*) and 8(*c*)).

As shown in FIG. 6, when a receiving groove 21*a* of the feeding rotor 21 rotating in the clockwise direction in the diagram is aligned with the chute connection point, the base element 1 supplied from the pipe-like chute S is inserted into the receiving groove 21*a*. When the base element 1 inserted into the receiving groove 21*a* rotates together with the feeding rotor 21 to reach a position right under the rotational shaft, one of the receiving grooves 22*a* of the relay rotor 22 rotating in the counterclockwise direction in the diagram is positioned below that position simultaneously, and the base element 1 is dropped and inserted into the interior of the receiving groove 22*a*. The base element 1 inserted into the receiving groove 22*a* rotates together with the relay rotor 22 while being sucked by the negative pressure in the air suction hole 22*b*.

As shown in FIG. 7, when the base element 1 sucked in the receiving groove 22*a* rotates together with the relay rotor 22 to reach a position right under the rotational shaft, the opposed chucks 26 on the chuck wheels 25 rotating in the clockwise direction are positioned on both sides of that position (see FIG. 8(*a*)) simultaneously. Of the two chucks 26 which have reached that position, the chuck 26 on the chuck wheel 25 on the left side of FIG. 5 is removed toward the right in the diagram by the spring biasing force under the action control of the chucking control unit 29, whereupon the base element 1 fed to the space between the opposed chucks 26 is clamped and held by the two chucks 26 (see FIGS. 8(*b*) and 8(*c*)).

As shown in FIG. 10, when pulley part 26*a* of the chuck 26 holding the base element 1 comes into contact with the belt 27 through the rotation of the chuck wheel 25, the belt 27 rotating in the counterclockwise direction causes the chuck 26 holding the base element 1 to start to rotate in the opposite direction (clockwise direction). It is to be noted that at the stage of this start of rotation the grinding blade 28 has not yet come into contact with the base element 1.

Figure 11:
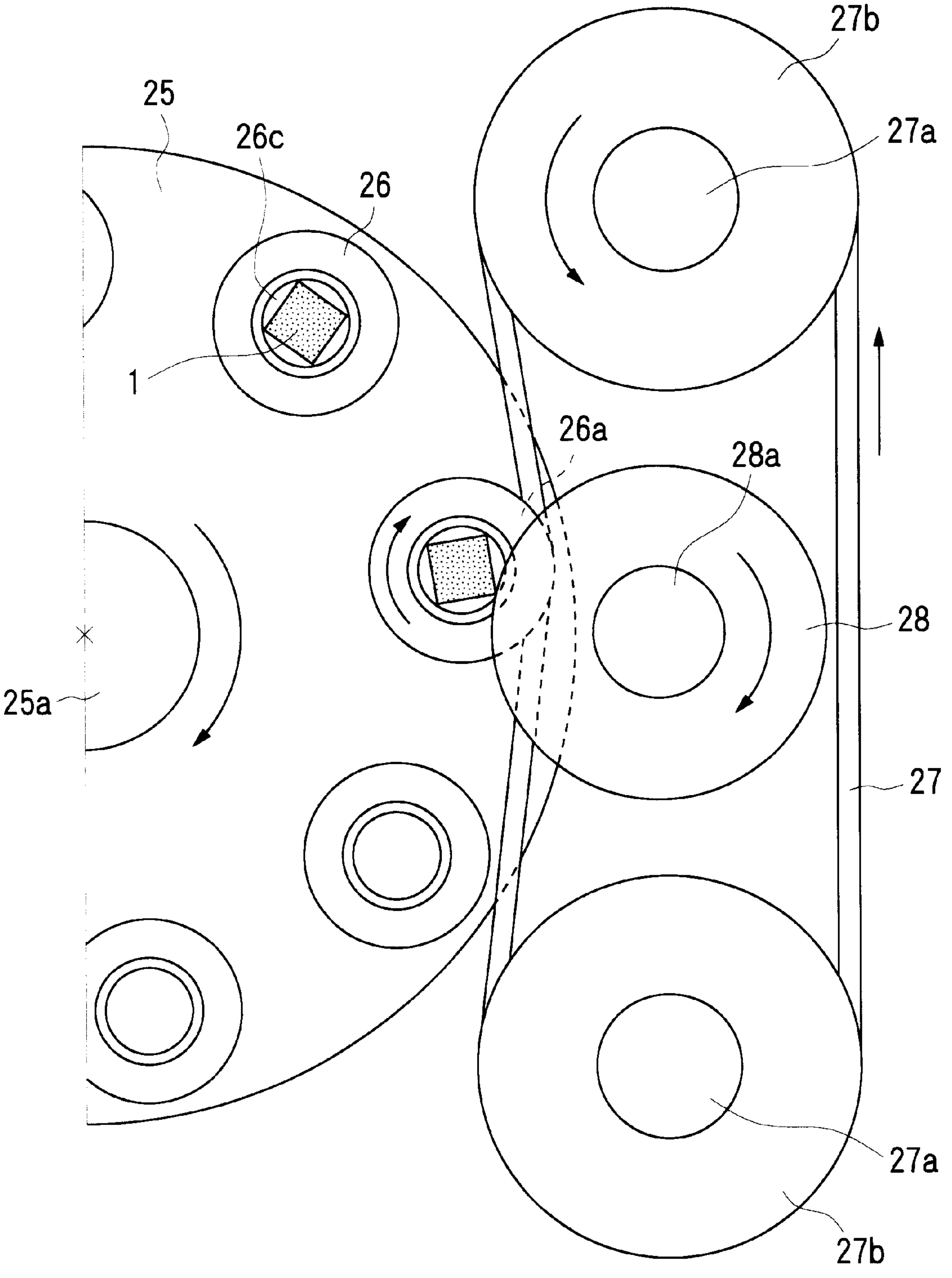

As shown in FIG. 11, when the rotation of the chuck wheel 25 advances from the state of FIG. 10, the grinding blade 28 rotating in the clockwise direction is retained by the opposed chucks 26 and comes into contact with the center of the rotating base element 1 to start the grinding of that portion.

Figure 12:
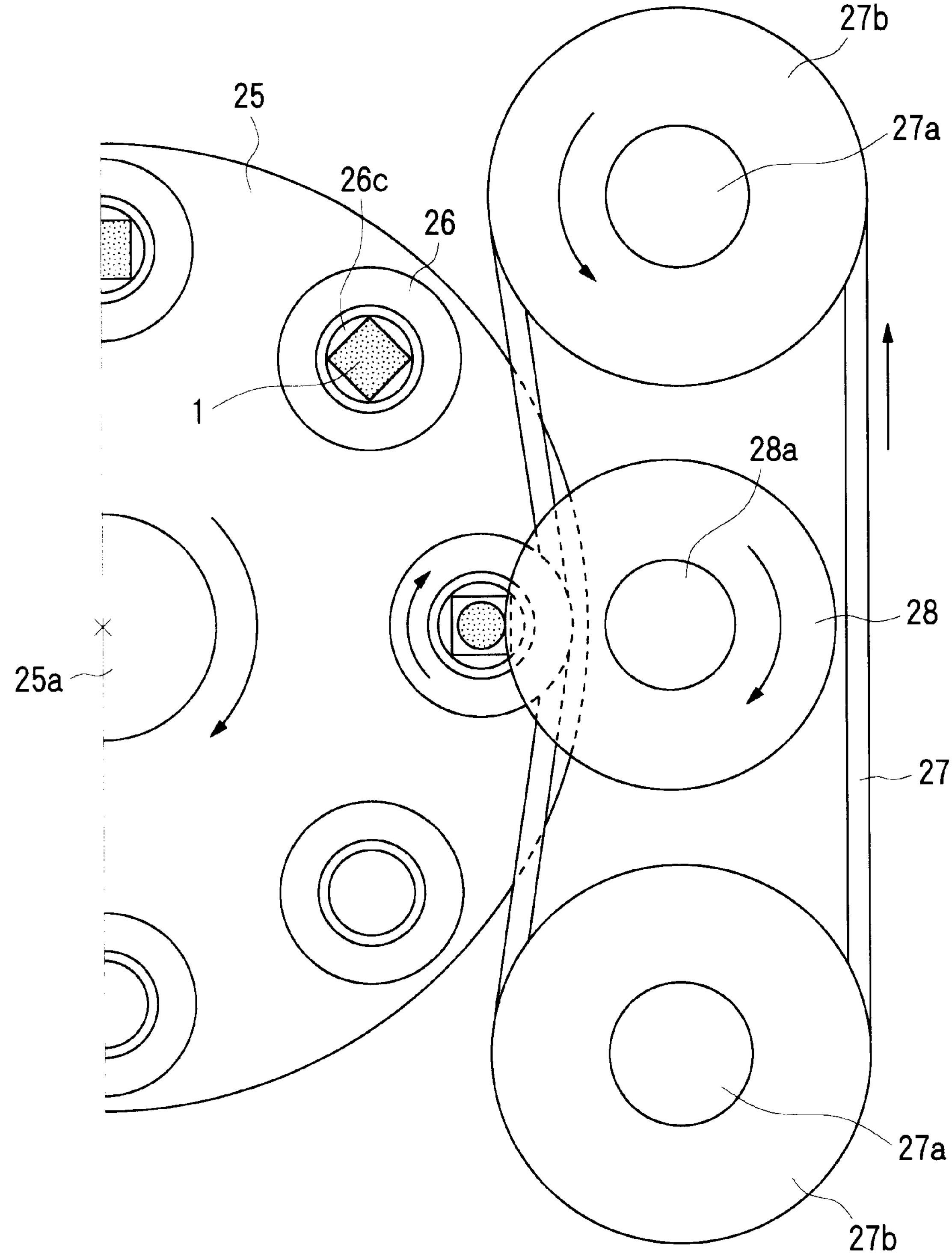

As shown in FIG. 12, when the rotation of the chuck wheel 25 further advances from the state of FIG. 11, the grinding operation continues while gradually increasing the grinding depth of the grinding blade 28 relative to the base element 1 until the center of rotation of the base element 1 becomes level with the center of rotation of the grinding blade 28. In other words, the grinding operation of the base element 1 by the grinding blade 28 is basically completed when the center of rotation of the base element 1 is coincident in height with the center of rotation of the grinding blade 28.

Figure 13:
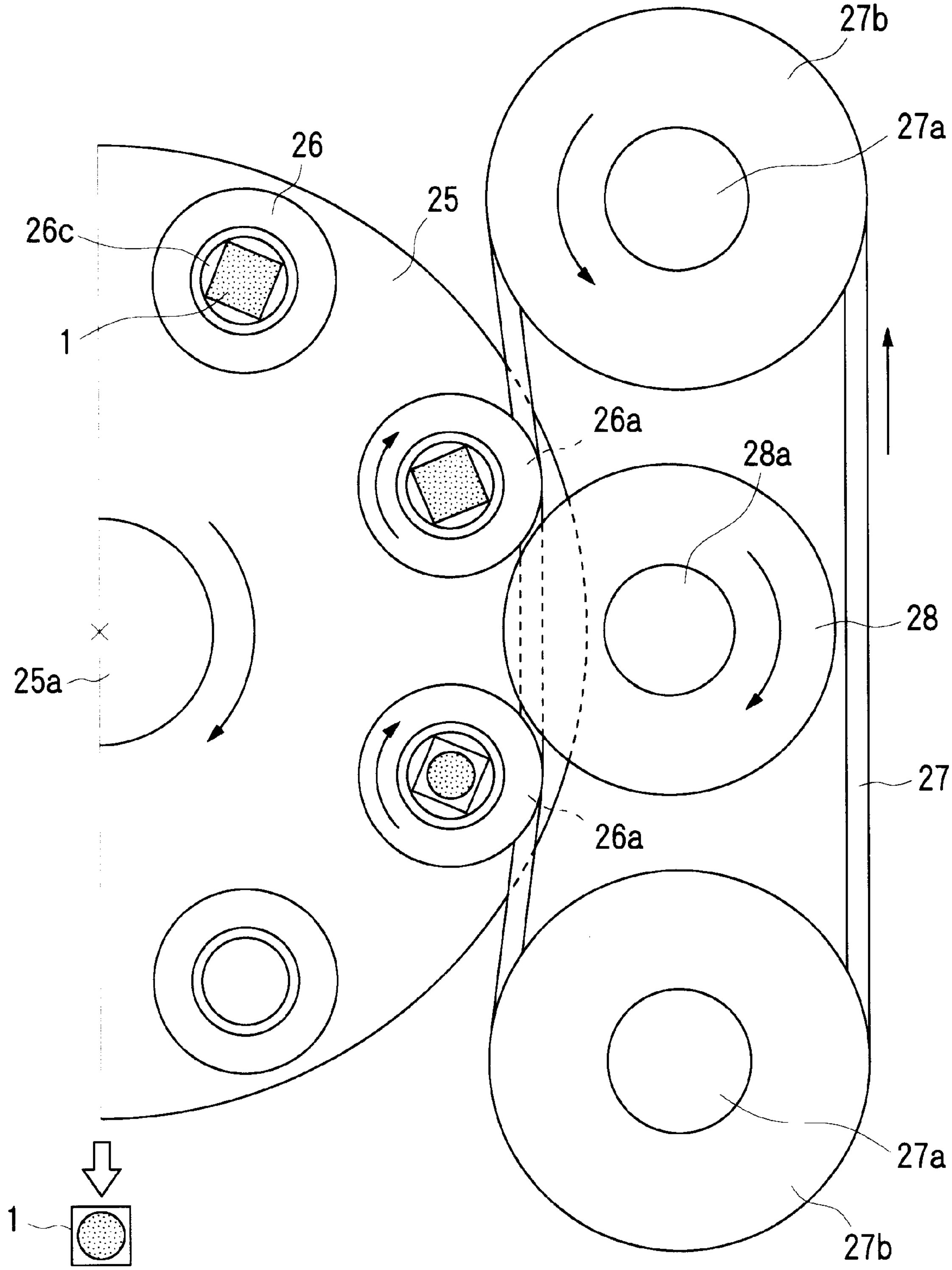

As shown in FIG. 13, when the rotation of the chuck wheel 5 further advances from the state of FIG. 12, the pulley part 26*a* of the succeeding chuck 26 holding a base element 1 comes into contact with the belt 27 to exegrinde the grinding operation on the succeeding base element 1 in the same procedure as the above. When the chucks 26 holding the grind base element 1 reach a position right under the shaft 25*a*, the chuck 26 on the chuck wheel 25 on the left side of FIG. 5, of the two chucks 26 which have reached that position, is removed toward the left in the diagram against the spring biasing force under the action control of the chucking control unit 29, so that the clamping of the base element 1 by the chucks 26 is released and the base element 1 drops by gravity into a container or the like disposed below. In this manner, the unit element 2 with the shape shown in FIG. 1(*b*) can be manufactured.

Figure 14:
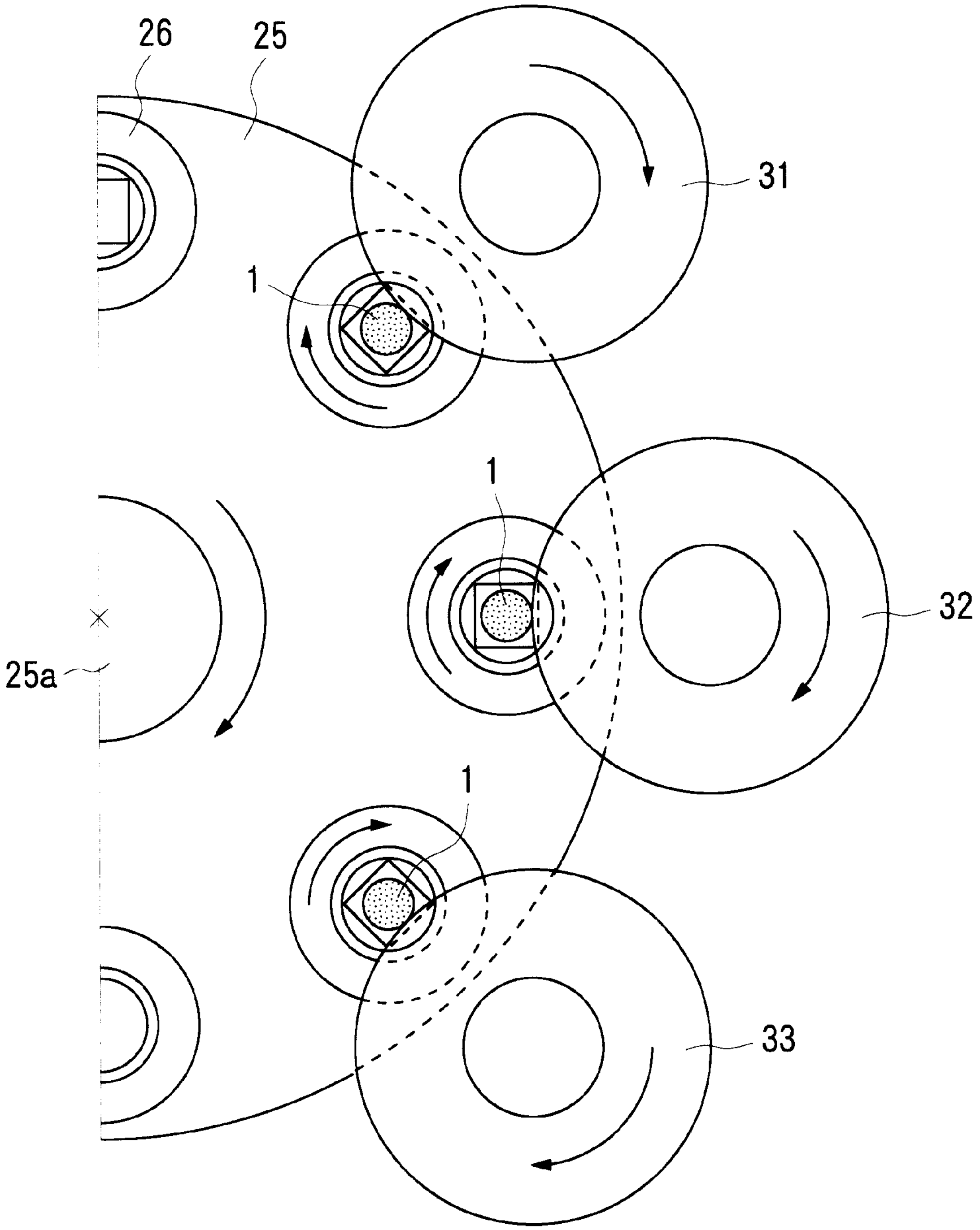
FIG. 14 shows a variant of the unit element manufacturing apparatus shown in FIG. 5.

Although the grinding of the base element 1 can be effected by use of a single grinding blade 28 as mentioned above, a plurality of grinding blades having different degrees of roughness may be arranged along a move path (arc trajectory) of the base element 1. For example, as shown in FIG. 14, there may be arranged in sequence three different grinding blades 31 for rough grinding, 32 for fine grinding and 33 for finish grinding, respectively, or two different grinding blades 31 for rough grinding and 32 for fine grinding, respectively, to thereby subject the base element 1 to a stepwise grinding operation with different degrees of roughness for more precise grinding. It is natural in the case of using a plurality of grinding blades, a grinding method is also possible in which the maximum grinding depth differs for each blade to stepwise increase the grinding depth.

Although there has exemplarily shown a type holding and releasing the base element 1 by removing one of the opposed two chucks 26 closer to or away from the other, another type of chuck having a clamping feature, e.g., a chuck with claws capable of opening and closing may be employed so that the hold and release of the base element can be carried out on the chuck basis without any need to remove the chuck itself.

Description will now be made of a specific technique for the above-described armoring step in connection with the configuration of the apparatus used in that step.

Figure 15:
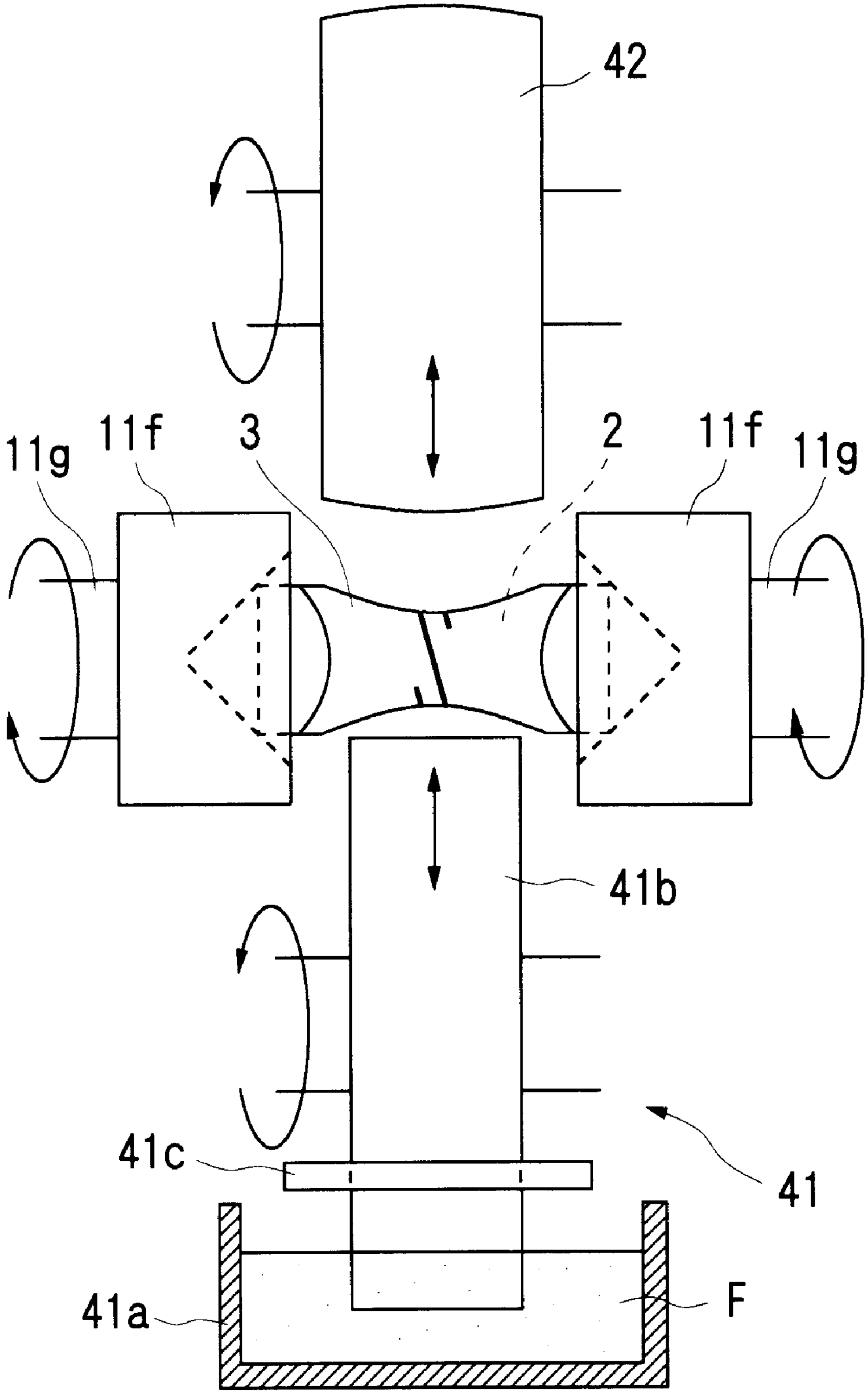
FIG. 15 shows an example of an armoring apparatus for use in an armoring step.

Referring to FIG. 15, there is depicted by example a armoring apparatus which comprises a coating mechanism generally designated at 41 and a modifying roller 42. In the diagram, reference numeral 11*f* denotes a chuck and 11*g* denote a chuck shaft, which are similar to those of the FIG. 3 apparatus.

The coating mechanism 41 includes a vessel 41*a* for storing therein a paste-like armoring material F capable of being hardened, a coating roller 41*b* whose part is immersed in the armoring material F within the vessel 41*a*, a blade 41*c* for scraping down an excess armoring material F adhered to the coating roller 41*b*, a drive source not shown for rotating the coating roller 41*a* in a predetermined direction, and another drive source not shown for advancing and retreating the entire apparatus toward and from the unit element 2 held by the chucks 11*f*.

The modifying roller 42, on the other hand, removes an excess armoring material F adhered to the resistance conductor 3 on the hourglass-shaped part 2*b* to modify the adhesion shape and is adapted to rotate in a predetermined direction and to advance and retreat toward and from the unit element 2 held by the chucks 11*f*. The outer peripheral surface of the modifying roller 42 is provided with a rounding corresponding to a shape of the armor 4.

Figure 16:
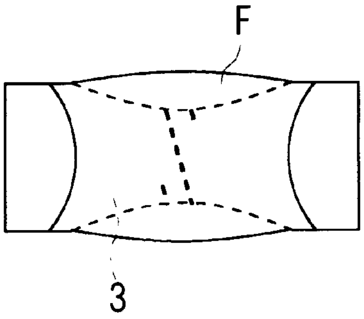
FIGS. 16(*a*) and 16(*b*) shows a technique for the armoring step.
Figure 16:
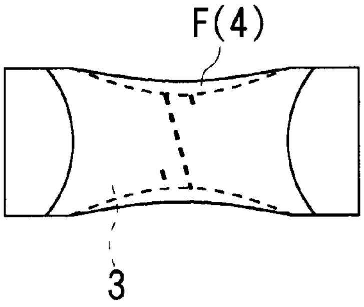

Thus, by bringing the coating roller 41*b* closer to the trimmed unit element 2 which is rotated in a predetermined direction, the armoring material F can be coated on the surface of the resistance conductor 3 on the hourglass-shaped part 2*b*. Herein, more armoring material F than needed is coated thereto and hence the adhered armoring material F becomes an hourglass shaped. Accordingly, before hardening of the adhered armoring material F, as shown in FIG. 16(*b*), the modifying roller 42 is advanced to the armoring to scrape an excess armoring material F to modify into an hourglass shape.

Figure 17:
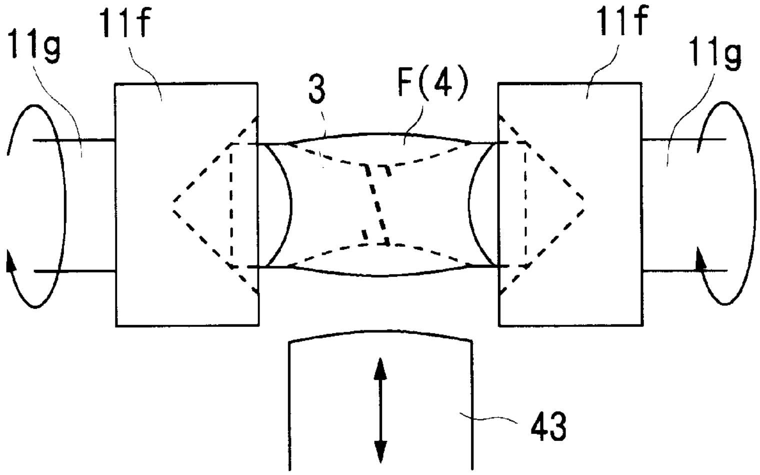
FIG. 17 shows another technique for the armoring step.

As an alternative to the above for the formation of the armor 4, as shown in FIG. 17, after hardening of the adhered armoring material F, a grinding blade 43 for the modification of armor may be advanced to scrape off the excess armoring material F to modify into a hourglass shape.

In this manner, according to a series of manufacturing processes described hereinabove, there is ensured a secure and stable manufacture of such a chip resistor as shown in FIG. 2, that is, a chip resistor having an external appearance of prism shape at both ends and of hourglass shape at the center. Since in this chip resistor the electrode conductor 5 is formed on the prism-shaped parts 2*a* at both ends, one of the side surfaces of the electrode conductor 5 could be utilized as a mounting surface to ensure a stable component mounting onto a substrate or the like while preventing a rolling of the component itself.

Furthermore, by virtue of smoothly continuous boundaries between the prism-shaped parts 2*a* and the hourglass-shaped part 2*b* which constitute the unit element 2, it will be prevented for the boundaries to have a lower strength than the other portions and hence to be subjected to an occurrence of cracks even though any stress is applied thereto during and after the component mounting.

Also, by grinding the center of the prism-shaped base element 1, there can be readily obtained the unit element 2 having a shape shown in FIG. 1(*b*). Furthermore, by grinding after provisional burning of an unburned ceramic base element 1, the grinding operation is achieved easier and more proper compared with the case in which an unburned base element is grind.

Moreover, while rotating the prism-shaped base element 1, its center is ground by the grinding blade 12 or 28 so that the grinding blade 12 or 28 has only to come closer to the base element 1 to ensure a secure and stable acquisition of the unit element 2 having a shape shown in FIG. 1(*b*).

In addition, through a stepwise grinding operation by the grinding blades 12, 12*b* or 31, 32, 33 having different grinding degrees of roughness and/or different grinding depth, a unit element 2 with a higher dimensional precision can be obtained.

Above all, use of the apparatus shown in FIG. 5 ensures that while rotating the base element 1 around its central axis and translating the rotational axis in parallel along the predetermined arc trajectory, the base element 1 is ground around its center by the grinding blade 28 rotating at a position adjacent to the arc trajectory, thereby effecting a desired grinding operation with a gradual increase of grinding depth of the grinding blade 8 relative to the base element 1. Therefore, even when the base element 1 has small dimensions, the initial grinding resistance could be remarkably reduced to securely avoid the problem of occurrence of cracks or fractures, thereby achieving a highly efficient and precise manufacture of the unit element 2 having a desired shape.

Furthermore, since the unit elements 1 held by the chucks 6 can be sequentially fed to the grinding blade 8 side, it would be possible to eliminate time lost in the feeding and hence to significantly reducing a total time needed for the grinding operation, achieving an increased productivity.

In addition, because an excess armoring material is removed before or after hardening after the armoring material F onto the surface of the resistance conductor 3 lying on the hourglass-shaped part 2*b*, the thickness of the armor 4 could be so modified that the level of the surface of the armor 4 becomes lower than the level of the surface of the electrode conductor 5, while simultaneously enabling the armor 4 to be finished cleanly at a high precision.

In the unit element manufacturing apparatus shown in FIGS. 3 and 5, a unit element having a different shape from that of FIG. 1(*b*) can be simply obtained by altering the shape of the grinding edge or the grinding depth of the grinding blade. FIGS. 18 to 24 show examples of the shape which can be employed in place of the unit element 2 shown in FIG. 1(*b*).

Figure 18:
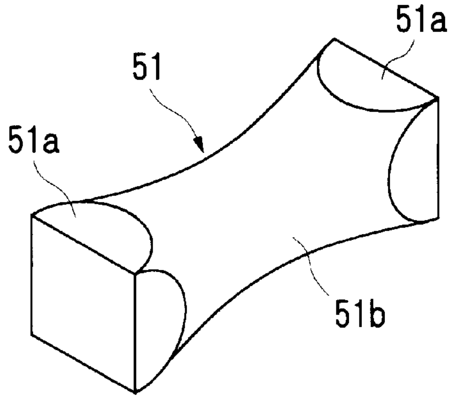
FIGS. 18, 19, 20, 21, 22(*a*), 22(*b*), 23 and 24 shows examples of the shape of a unit element replaceable in place of the unit element shown in FIG. 1(*b*)

A unit element 51 shown in FIG. 18 has an hourglass-shaped part 51*b* intervening between prism-shaped parts 51*a* at both ends. The unit element 51 differs in shape from the unit element 2 shown in FIG. 1(*b*) in that its prism parts 51*a* are short in length.

Figure 19:
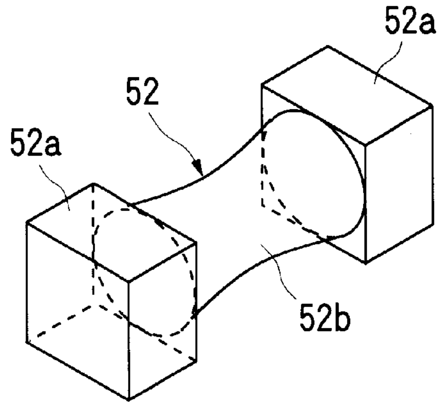

A unit element 52 shown in FIG. 19 has an hourglass-shaped part 52*b* intervening between prism-shaped parts 52*a* at both ends. The unit element 52 differs in shape from the unit element 2 shown in FIG. 1(*b*) in that the maximum outer diameter of the hourglass-shaped part 52*b* is coincident with an inscribed circle of a cross-section of the prism-shaped parts 52*a*.

Figure 20:
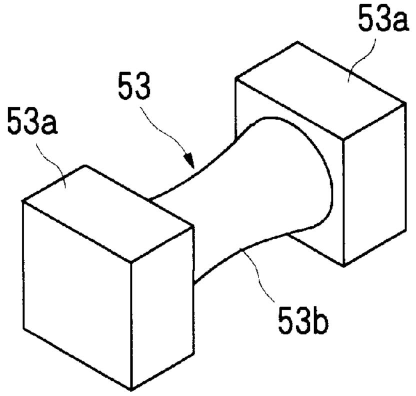

A unit element 53 shown in FIG. 20 has an hourglass-shaped part 53*b* intervening between prism-shaped parts 53*a* at both ends. The unit element 53 differs in shape from the unit element 2 shown in FIG. 1(*b*) in that the maximum outer diameter of the hourglass-shaped part 53*b* is smaller than the diameter of an inscribed circle of a cross-section of the prism-shaped parts 53*a*.

Figure 21:
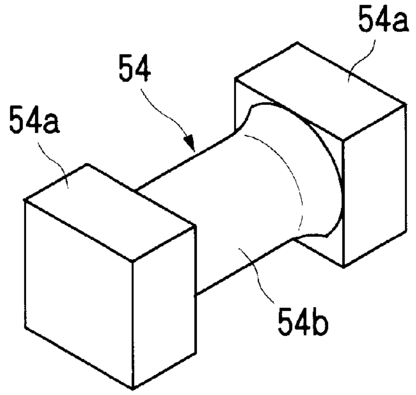

A unit element 54 shown in FIG. 21 has an hourglass-shaped part 54*b* intervening between prism-shaped parts 54*a* at both ends. The unit element 54 differs in shape from the unit element 2 shown in FIG. 1(*b*) in that the hourglass-shaped part 54*b* has a cylindrical central portion.

Figure 22:
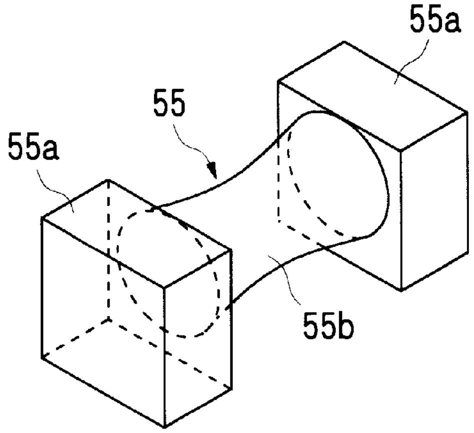
Figure 22:
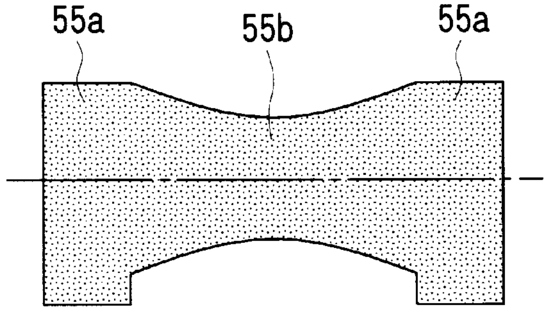

A unit element 55 shown in FIGS. 22(*a*) and 22(*b*) has an hourglass-shaped part 51*b* intervening between prism-shaped parts 51*a* at both ends. The unit element 55 differs in shape from the unit element 2 shown in FIG. 1(*b*) in that the central axis of the prism-shaped parts 55*a* at both ends is vertically offset from the central axis of the hourglass-shaped part 55*b* to impart an eccentric positional relationship to the two parts. Herein, FIG. 22(*a*) is a side elevational view of the unit element 55 and FIG. 22(*b*) is a longitudinal section thereof.

Figure 23:
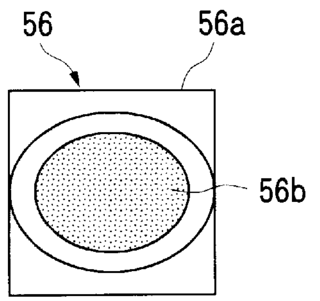

A unit element 56 shown in FIG. 23 has an hourglass-shaped part 56*b* intervening between prism-shaped parts 56*a* at both ends. The unit element 55 differs in shape from the unit element 2 shown in FIG. 1(*b*) in that the hourglass-shaped part 56*b* has an elliptical reference cross-section.

Figure 24:
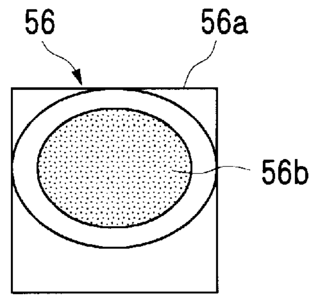

A unit element 57 shown in FIG. 24 has an hourglass-shaped part 57*b* intervening between prism-shaped parts 57*a* at both ends. The unit element 57 differs in shape from the unit element 2 shown in FIG. 1(*b*) in that the hourglass-shaped part 57*b* has an elliptical reference cross-section and in that the central axis of the prism-shaped parts 57*a* at both ends is vertically offset from the central axis of the hourglass-shaped part 57*b* to impart an eccentric positional relationship to the two parts.

Figure 25:
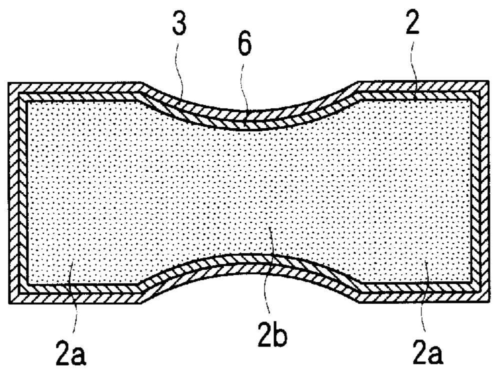
FIGS. 25(*a*) to 25(*d*) shows an embodiment comprising an additional step of forming an interconnection film between the unit element and a resistance conductor.
Figure 25:
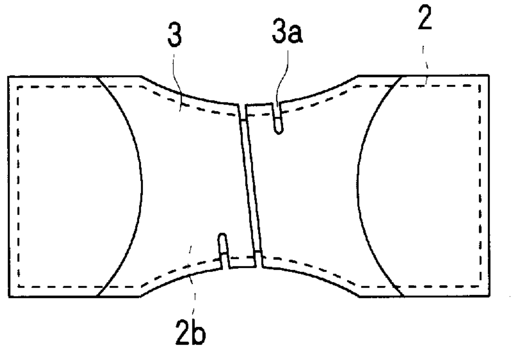
Figure 25:
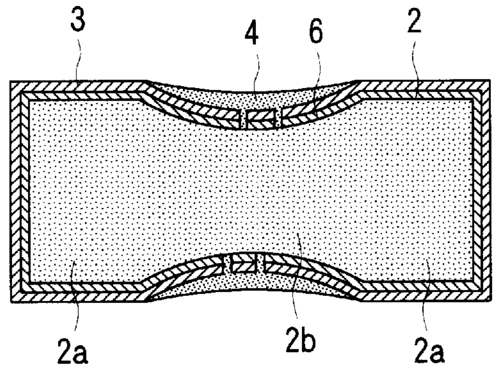
Figure 25:
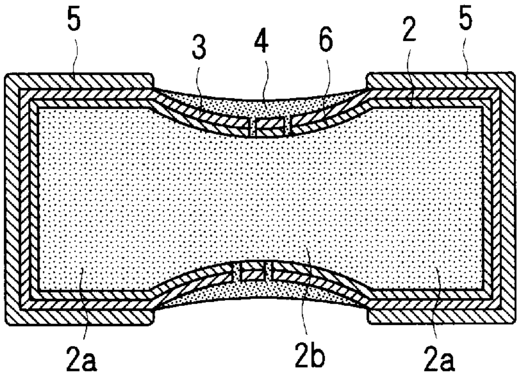

Referring to FIGS. 25(*a*) to 25(*d*), there is depicted an embodiment comprising an additional step of forming an interconnection film 6 between the unit element 2 and the resistance conductor 3. The other steps are substantially the same as those described with reference to FIG. 1, so an explanation of the other steps is omitted and identical reference numerals are used.

The film 6 is made of a material which is compatible with both the unit element 2 and the resistance conductor 3 (compatibility in material), for instance, a base metal such as Ni, Cr, Ni—Cr alloy or their alloys. The film 6 is formed over the entire surface of the unit element 2 at a thickness of the order of 1 $\mu$m by use of a thin-film forming technique such as sputtering or vacuum deposition. After the formation of the interconnection film 6, the resistance conductor 3 is formed on top of the entire surface of the film 6.

Thus, the intervention of the film 6 made of a material compatible (compatibility in material) with both the unit element 2 and the resistance conductor 3 therebetween contributes to an increase in bonding power exerted between the unit element 2 and the resistance conductor 3. Accordingly, even though a stress is applied to the component during or after mounting thereof, the resistance conductor 3 can be securely prevented from being peeled off from the unit element 2, while ensuring the stable quality and characteristics of the component.

Figure 26:
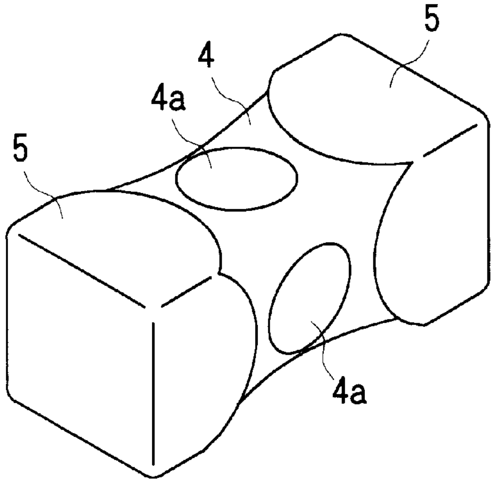
FIG. 26 shows another embodiment comprising an additional step of partially forming flat areas on the surface of the armor.

FIG. 26 shows another embodiment comprising an additional step of partially forming flat areas 4*a* on top of the surface of the armor 4. The other steps are substantially the same as those described with reference to FIG. 1.

Figure 27:
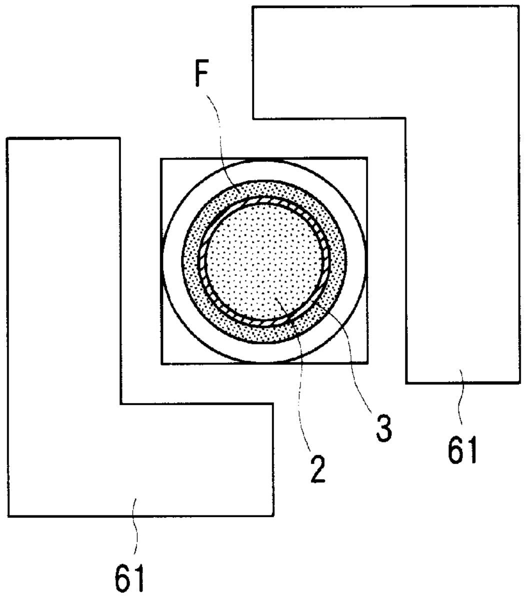
FIGS. 27(*a*) and 27(*b*) shows a technique for partially forming the flat areas on the surface of the armor.
Figure 27:
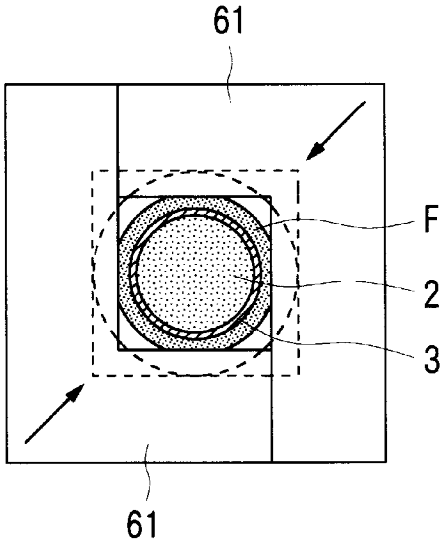

A method of forming the flat areas 4*a* as shown in FIG. 26 on the surface of the armor 4 includes a method in which a pair of L-shaped templates 61 are pressed against the armoring material F prior to hardening of the coated armoring material F as shown in FIGS. 27(*a*) and 27(*b*), and a method in which posterior to hardening of the coated armoring material F the surface is partially planed off by a grinding blade.

The flat areas 4*a* thus partially formed on the surface of the armor 4 could facilitate the suction of the components by means of a suction nozzle or the like. In this case, the flat areas 4*a* may be formed parallel to the surfaces of the electrode conductors 5 lying on the prism-shaped parts, thereby enabling the suction posture to conform to the mounting posture.

Figure 28:
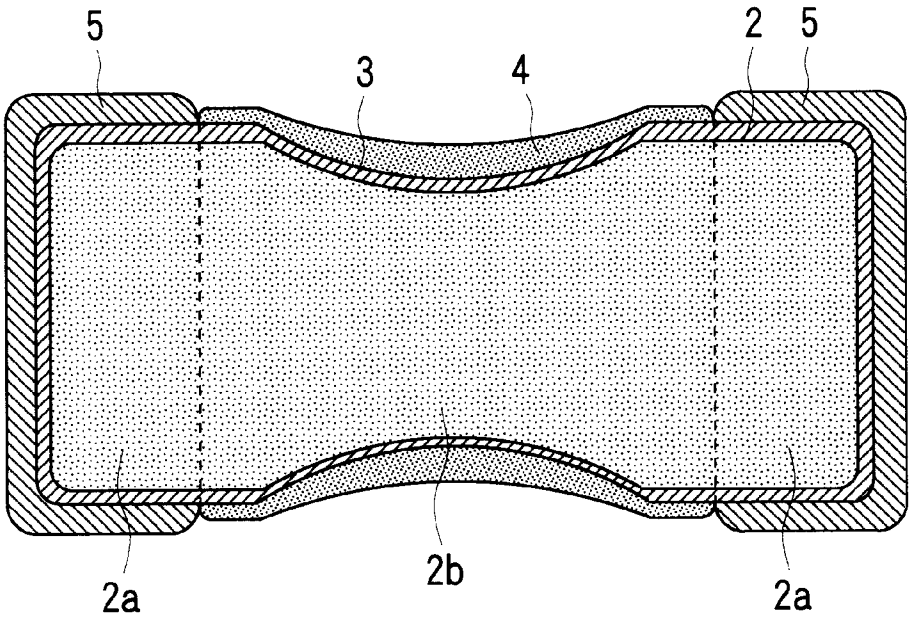
FIG. 28 shows an embodiment in which the edges of the armor are extended as far as over prism parts of the unit element.

FIG. 28 shows still another embodiment in which the terminal edges of the armor 4 are extended as far as on the prism-shaped parts 2*a* of the unit element 2, with the electrode conductors 5 being so formed as to abut the terminal edges of the armor 4 or to be adjacent thereto by slightly spaces.

Thus, extension of the terminal edges of the armor 4 as far as on the prism-shaped parts 2*a* would enable the boundaries between the hourglass-shaped part 2*b* and the prism-shaped parts 2*a* to be covered by the armor 4, while simultaneously rendering the shape of the side surfaces of the electrode conductors 5 a perfect rectangle.

Figure 29:
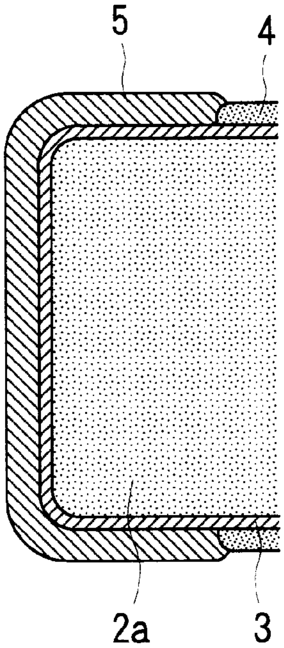
FIGS. 29(*a*) and 29(*b*) shows a variant of the case in which the edges of the armor are extended as far as over the prism parts of the unit element.
Figure 29:
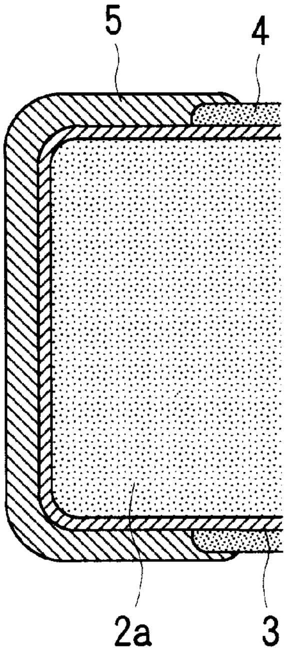

Besides, the end edges of the electrode conductors 5 may overlap the end edges of the armor 4 as shown in FIG. 29(*a*) or 29(*b*) so that the electrode conductors 5 can prevent the armor 4 from peeling off starting from its end edges.

Figure 30:
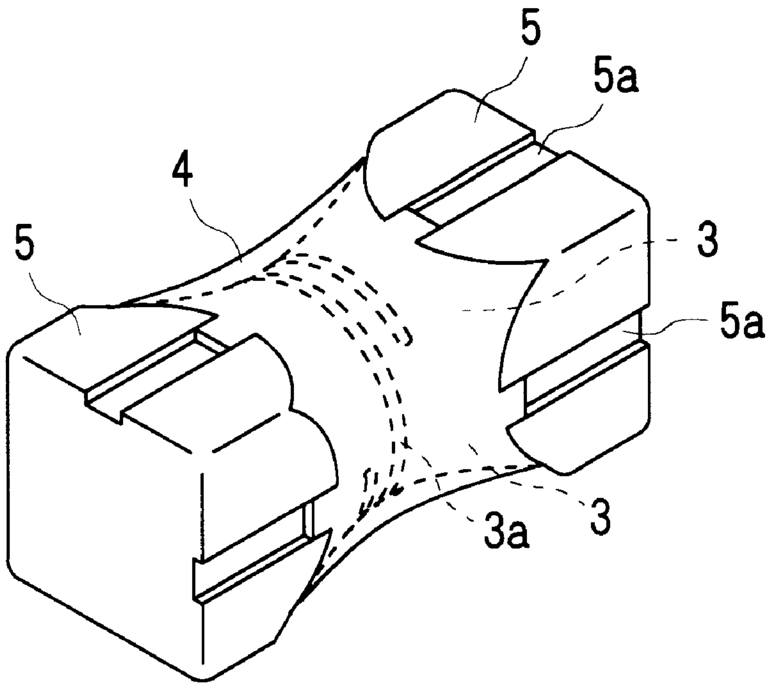
FIG. 30 is a diagram showing an embodiment in which the surface of the electrode conductor is provided with recesses into which a part of the armor infiltrates.
Figure 31:
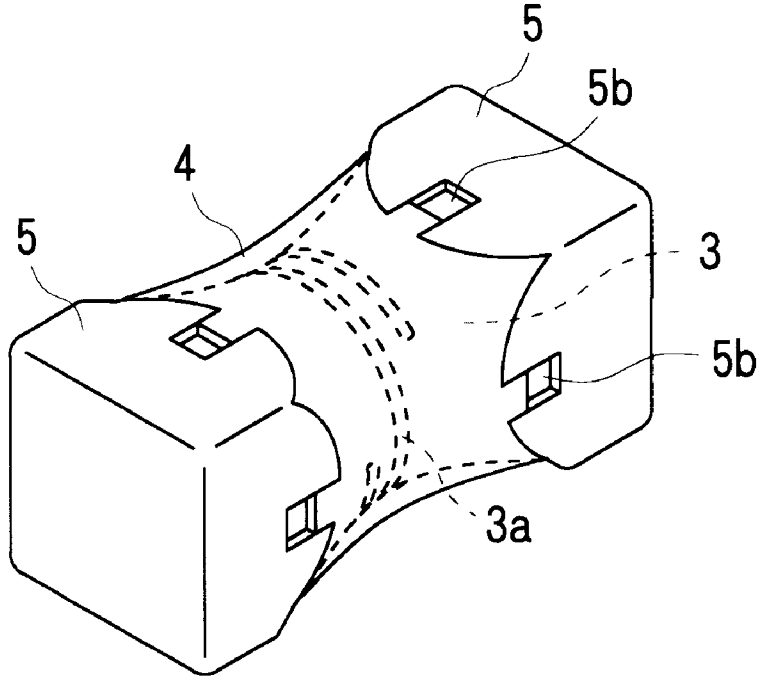
FIG. 31 is a diagram showing another embodiment in which the surface of the electrode conductor is provided with recesses into which a part of the armor infiltrates.

FIGS. 30 and 31 shows a still further embodiment in which the surfaces of the electrode conductors 5 are formed with recesses 5*a* or 5*b* into which a part of the armor 4 infiltrates. In this case, that the electrode conductor forming step precedes the armor forming step.

A method of forming the recesses 5*a* or 5*b* as shown in FIGS. 30 and 31 in the surfaces of the electrode conductors 5 include a partial grinding of the surfaces of the electrode conductors 5 by a grinding blade after the formation of the electrode conductors 5, and a partial removal of the surfaces by the irradiation of laser beam.

In this manner, by forming the armor 4 after providing the surfaces of the electrode conductors 5 with the recesses 5*a* or 5*b*, it would be possible for excess armoring material to escape into the recesses 5*a* or 5*b*, thereby preventing the end edges of the armor 4 from being locally swelled or from riding onto the electrode conductors 5, while simultaneously providing effective measures for preventing the level of the surface of the armor 4 from exceeding the level of the surfaces of the electrode conductors 5.

By the way, when mounting the above-described chip resistor on the substrate or the like, more specifically, when connecting the electrode conductors to the electrodes on the substrate by way of a bonding material such as solder, there may possibly occur defective postures such as raised chip phenomena due to an unevenness in mass of the bonding material.

Figure 32:
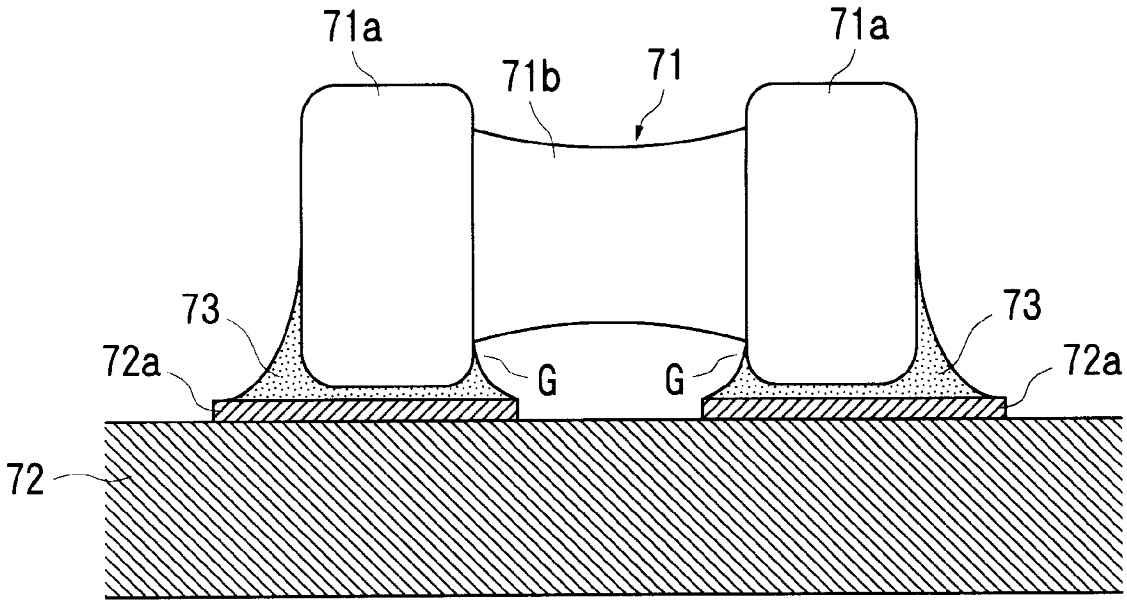
FIG. 32 is a diagram showing a method of mounting the chip resistor and the structure thereof.
Figure 33:
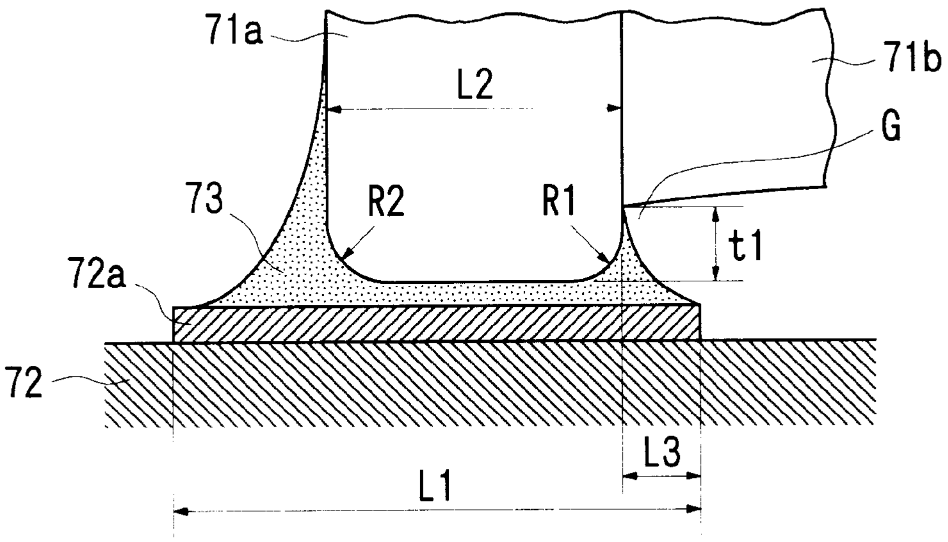
FIG. 33 is a partly enlarged view of FIG. 32.

In order to prevent such a defective connection, it is preferable to employ a mounting structure as shown in FIGS. 32 and 33. In the diagram, reference numeral 71 denotes a chip resistor having the same configuration as that of FIG. 2. The chip resistor 71 includes electrode conductors 71*a* and an armor 71*b*. Reference numeral 72 denotes a substrate having a top surface on which substrate electrodes 72*a* are formed. Reference numeral 73 denotes a bonding material such as solder.

At the boundaries between the electrode conductors 71*a* and the armor 71*b*, the chip resistor 71 has gaps G where the armor 71*b* is inwardly hollowed relative to the surfaces of the electrode conductors 71*a*, with the surfaces of the gaps G being covered by a part of the electrode conductors 71*a*. The edges of the electrode conductors 71*a* are rounded off. The rounding R1 adjoining the gaps G has a radius of curvature ranging from 10 to 70 μm, preferably from 10 to 30 μm. The edges adjoining the end surfaces are also provided with the rounding R2 having a radius of curvature equal to or preferably larger than that of R1.

On the other hand, the top surface of the substrate 72 is formed with rectangular or circular electrodes (lands) 72*a* corresponding to the electrode conductors 71*a* of the chip resistor 71. The length L1 of the substrate electrodes 72*a* is larger than the length L2. In the mounted state, the electrode conductor 71*a* is positioned on the corresponding substrate electrode at or near its center in the longitudinal direction. Furthermore, the height t1 of the gap exposure surface of the electrode conductor 71*a* is equal or approximate to the length L3 which is a distance on the substrate electrode 72*a* from the boundary between the electrode conductor 71*a* and the armor 71*b* up to its edge toward the armor 71*b*.

Prior to the mounting of the chip resistor 71, a substrate 72 is prepared which has thereon substrate electrodes 72*a* precoated with cream solder 73. The electrode conductor 71*a* is registered with the substrate electrode 72*a* corresponding thereto and the chip resistor 71 is mounted on the substrate 72. After the mounting of the component, the cream solder 73 is heated and melted. The molten solder 73 then hardens to electrically connect the electrode conductor 71*a* with the substrate electrode 72*a*.

In this manner, at the boundaries between the electrode conductors 71*a* and the armor 71*b*, there is provided the gaps G at which the armor 71*b* is inwardly hollowed to expose the surface of the electrode conductors 71*a* to the exterior. Thereby, the heated and molten solder 73 can reach the end surface and adjacent two side surfaces and adhere thereto while simultaneously reaching the gap G to adhere to the gap exposure surface of the electrode conductor 71*a*.

Thus, by allowing the molten solder 73 to reach both the end surface side and the armor side of the electrode conductor 71*a*, it would become possible to restrain the mass of solder 73 from collecting only on the end surface side. Thereby, preventing the chip resistor 71 in the course of the connecting operation is prevented from being forced to raise that component irrespective of some imbalance in solder hardening rate or in the mass of solder on the electrode conductors 71*a* at both ends, to consequently make difficult the occurrence of defective postures such as raised chip phenomena.

The provision of the rounding R1 on the edge of the electrode conductor 71*a* adjoining the gap G would enable the molten solder 73 to smoothly reach the gap exposure surface of the electrode conductor 71*a*, to increase the solder adhesion area on the gap exposure surface.

Furthermore, since the substrate electrode 72*a* has a length L1 larger than the length L2 of the electrode conductor 71*a*, with the electrode conductor 71*a* positioned at or near the center of the substrate electrode 72*a* in the longitudinal direction. Thereby, the molten solder 73 can efficiently reach both the end surface side and the armor side of the electrode conductor 71*a*, making it possible to securely prevent the raised chip phenomena.

Furthermore, since the height t1 of the gap exposure surface of the electrode conductor 71*a* is equal or approximate to the length L3 of the substrate electrode 72*a* from the boundary between the electrode conductor 71*a* and the armor 71*b* up to its edge toward the armor 71*b*. Thereby, the solder 73 adhered to the gap exposure surface of the electrode conductor 71*a* can present a proper shape, contributing to an increase in the connection strength.

Although the present invention has been exemplarily applied to a chip resistor which is typical of chip components hereinabove, it is natural that the present invention is not intended to be limited to the chip resistor, but is widely applicable to other chip components, for instance, a chip jumper, a chip inductor, etc., comprised of a unit element which carries thereon a circuit conductor, electrode conductors and an armor.

What is claimed is:

1. A method of manufacturing a chip component, comprising the steps of:

burning an unburned unit element made of ceramics having prism-shaped parts at its ends;

polishing edges of said burned unit element; and forming on said polished unit element a circuit conductor, an electrode conductor and an armor.

2. A method of manufacturing a chip component according to claim 1, further comprising the step of:

preparing said unit element by grinding an unburned prism-shaped base element made of ceramics around its center.

3. A method of manufacturing a chip component according to claim 2, wherein said step of preparing said unit element includes, grinding said base element around its center by a grinding tool while rotating said base element.

4. A method of manufacturing a chip component according to claim 2, wherein said step of preparing said unit element includes, grinding said base element around its center by a grinding tool rotating at a position adjacent to a predetermined arc trajectory while rotating said base element around its central axis or an axis parallel thereto and translating said rotational axis parallely along said arc trajectory.

5. A method of manufacturing a chip component according to claim 3, wherein:

said base element is ground by a plurality of grinding tools each having at least either difference of grinding roughness or grinding depth.

6. A method of manufacturing a chip component according to claim 1, wherein:

an intermediate part between said prism-shaped parts of said unit element has an hourglass shape.

7. A method of manufacturing a chip component according to claim 6, wherein:

said hourglass-shaped part has a circular or elliptical basic cross section.

8. A method of manufacturing a chip component according to claim 6, wherein:

said prism-shaped parts and said hourglass-shaped part have an eccentric relationship.

9. A method of manufacturing a chip component according to claim 1, wherein:

burning of said unit element is imperfect provisional burning, said method further comprising the step of:

properly burning said unit element whose edges have been polished after said provisional burning.

10. A method of manufacturing a chip component according to claim 1, further comprising the step of:

forming an interconnection film between said unit element and said circuit conductor.

11. A method of manufacturing a chip component according to claim 1, wherein:, said step of forming said armor on said unit element includes, a step of controlling the thickness of said armor so that the surface level of said armor is lower than the surface level of said electrode conductor.

12. A method of manufacturing a chip component according to claim 11, wherein:

said step of controlling the thickness of said armor includes steps of coating an armor material able to harden and of removing an excess armor material before or after hardening.

13. A method of manufacturing a chip component according to claim 1, wherein:

said step of forming said armor on said unit element includes, a step of partially forming flat areas on the surface of said armor.

14. A method of manufacturing a chip component according to claim 1, wherein:

said step of forming said electrode conductor and said armor on said unit element includes, forming said electrode conductor and said armor so that the edge of said armor abut or is slightly spaced apart from the edge of said electrode conductor.

15. A method of manufacturing a chip component according to claim 14, wherein:

the edge of said armor is extended as far as over said prism-shaped parts.

16. A method of manufacturing a chip component according to claim 14, wherein:

the surface of said electrode conductor is formed with recess into which a part of said armor infiltrate.

* * * * *